US005537054A

United States Patent [19]

Suzuki et al.

[11] Patent Number: 5,537,054

[45] Date of Patent: * Jul. 16, 1996

[54] METHOD FOR TESTING AN ON-OFF FUNCTION OF SEMICONDUCTOR DEVICES WHICH HAVE AN ISOLATED TERMINAL

[75] Inventors: Masayoshi Suzuki, Hitachiohta; Jun-ichi Ohwada, Hitachi; Masaaki Kitazima, Hitachiohta; Hideaki Kawakami, Mito; Kenkichi Suzuki, Mobara, all of Japan

[73] Assignee: Hitachi, Ltd., Tokyo, Japan

[ * ] Notice: The portion of the term of this patent subsequent to Mar. 16, 2015, has been disclaimed.

[21] Appl. No.: 837,677

[22] Filed: Mar. 10, 1986

[30] Foreign Application Priority Data

| | | | |
|---|---|---|---|
| Mar. 18, 1985 | [JP] | Japan | 60-52300 |
| Aug. 23, 1985 | [JP] | Japan | 60-184278 |
| Aug. 23, 1985 | [JP] | Japan | 60-185153 |

[51] Int. Cl.[6] .......... G01R 31/26; G01R 31/02

[52] U.S. Cl. .......... 324/770; 324/769; 324/765

[58] Field of Search .......... 324/158.1, 73.1, 324/765, 768, 769, 770, 671, 537, 538, 662, 765; 437/8; 371/15.1; 364/550, 551.01

[56] References Cited

U.S. PATENT DOCUMENTS

| | | | |
|---|---|---|---|
| 3,059,183 | 10/1962 | McCallister | 324/768 |
| 5,377,030 | 12/1994 | Suzuki et al. | 324/770 |

OTHER PUBLICATIONS

Canard et al; "Voltage checking Device"; IBM Technical Disclosure Bulletin; vol. 8, No. 5; Oct. 1965; p. 806.

Garcia; "Voltage checking Device"; IBM Technical Disclosure Bulletin; vol. 8, No. 4; Sep. 1965.

*Primary Examiner*—Vinh P. Nguyen

*Attorney, Agent, or Firm*—Antonelli, Terry, Stout & Kraus

[57] ABSTRACT

A testing method is provided for a semiconductor device which includes a control terminal and a pair of main terminals wherein one of the main terminals is isolated from the outside by a dielectric. First, a voltage which changes with time is applied to the isolated main terminal through the dielectric. A control signal which controls conduction and non-conduction of the semiconductor device is the applied to the control terminal. Following this, the test is made by detecting a displacement current flowing through at least one of the two main terminals and the control terminal.

20 Claims, 18 Drawing Sheets

METHOD FOR TESTING AN ON-OFF FUNCTION OF SEMICONDUCTOR DEVICES WHICH HAVE AN ISOLATED TERMINAL

BACKGROUND OF THE INVENTION

This invention relates to a testing method of semiconductor devices and to a display device which uses such a testing method. More particularly, the invention relates to a testing method suitable for testing such types of semiconductor devices which have at least one of the main terminals thereof isolated electrically from the outside. The present invention also specifically relates a display device of the type in which a display member can be interposed between display electrodes.

Various testing methods are known in the art to judge whether or not a transistor having at least a pair of main terminals and a control terminal, for example, a semiconductor control device has a normal ON-OFF function. Such methods are essentially based upon the method which applies a d.c. bias across the collector and emitter (or the drain and source) of the transistor, applies a current to the base (or a voltage to the gate) bias and checks the collector (or the drain) current at that time. This method can be practised extremely easily if the three terminals of the transistor can be externally accessed, but can not be carried out if any one of the terminals cannot. This is because no circuit can be formed, and an entirely novel testing method is necessary in order to test those devices whose terminals cannot be externally accessed.

The description given above will be more easily understood from FIGS. 2 and 3 of the accompanying drawings which illustrate a definite example of the semiconductor devices. FIG. 2 shows a general purpose MOS (Metal Oxide Semiconductor) transistor 1. Generally, a drain terminal 2, a source terminal 3 and a gate terminal 4 of the transistor 1 are exposed to the outside. Whether or not this transistor can be used as a switch is checked by applying a d.c. voltage across the drain and the source from outside and applying a voltage to the gate terminal 4. Since a current flows through the drain or the source in this case, the ON function can be tested. (If the MOS transistor has no switch function, the current does not flow.)

However, this method cannot be applied to those devices in which one of the ends of the switch is open and hence a connection terminal cannot be externally accessed. In the device 1 of this type, the drain terminal is open under the state 2A and no contact can be established from outside.

An example of such devices whose terminals are not externally accessed is an active matrix display device using displays such as a liquid crystal, EL or the like. An extremely large number of devices shown in FIG. 3 are integrated in such a display. An example of the testing methods of the display device is disclosed, for example, in Japanese Patent Laid-Open No. 38498/1982. This prior art technique judges the leakage of the device from the change of a stored charge quantity of a capacitor after the passage of a predetermined time and thus measures any faults of an active matrix substrate used for liquid crystal display and the address. However, the prior art technique is not free from the problem that since the test is conducted after the liquid crystal is sealed, the liquid crystal becomes useless if the transistor has a defect. In addition, the prior art is based on the premise that a circuit for the test is incorporated in the display device, so that the device area cannot be reduced easily.

SUMMARY OF THE INVENTION

The present invention contemplates to provide a testing method capable of checking the ON-OFF function of a semiconductor device even if at least one of its main terminals is electrically isolated from outside, as well as a display device using such a method.

In a semiconductor device having at least one isolated main terminal, another main terminal land a control terminal, the first feature of the testing method of semiconductor devices to accomplish the object described above comprises the steps of:

(a) applying a voltage which changes with time to of the isolated main terminals or the other main terminal via a dielectric;

(b) applying a control signal for controlling conduction and non-conduction of the semiconductor device to the control terminal; and (c) detecting primarily a displacement current flowing through at least one of the members consisting of the isolated main terminals, the other main terminal and the control terminal, in order to test the semiconductor device.

In an apparatus including a plurality of first signal lines; a plurality of second signal lines crossing the first signal lines; and a plurality of semiconductor devices, each disposed at the point of intersection of the first and second signal lines, and having a control terminal connected to at least one of the first signal lines, one of the main terminals connected to at least one of the second signal lines and the other of the main terminals; the second feature of the present invention resides in a testing method of testing a semiconductor device comprising the steps of:

(a) applying a voltage which changes with time to at least the other of the main terminals through a dielectric;

(b) applying a control signal which controls conduction and non-conduction of the semiconductor device to the control terminal through the first signal line; and (c) detecting primarily a displacement current flowing through at least one of the members consisting of one of the main terminals, the other of the main terminals and the control terminal.

The third feature of the testing method of a semiconductor device in accordance with the present invention lies in that a control signal for controlling conduction and non-conduction of the semiconductor device is applied before the start of the change of the voltage which changes with time.

In a display device of the type in which a display member can be interposed between display electrodes, semiconductor switching devices are disposed at the points of intersection of a plurality each of scanning electrodes and signal electrodes, and the semiconductor switching devices which operate when signals exist on both of the scanning electrodes and the signal electrodes at the points of intersection apply the signal between the display electrodes. As such, a display device in accordance with the present invention is characterized in that voltage impression means for impressing a voltage is disposed between either of the display electrodes on the side of a substrate of the semiconductor switching devices and terminal electrodes of the semiconductor switching devices and either of the scanning electrodes and the signal electrodes around the semiconductor switching devices in such a manner as to form an electric circuit including the scanning electrodes, the signal electrodes, the voltage impression means and the semiconductor switching devices, and a voltage is impressed on the electric circuit to test the formation state thereof.

BRIEF DESCRIPTION OF THE DRAWINGS

FIGS. 22 and 17 are circuit diagrams showing the equivalent circuit of one pixel of FIG. 17.

DESCRIPTION OF THE PREFERRED EMBODIMENTS

Figure 1:
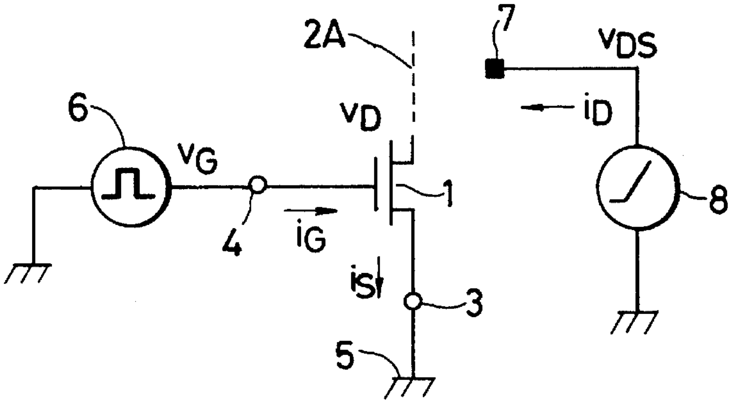
FIG. 1 shows the principle of the present invention.
Figure 2:
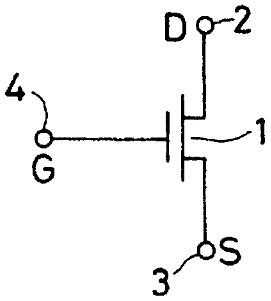
FIG. 2 PRIOR ART
FIG. 2 shows a typical conventional transistor.
Figure 3:
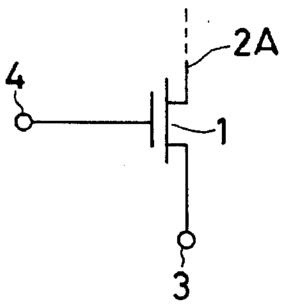
FIG. 3 PRIOR ART
FIG. 3 shows a circuit diagram of a transistor whose drain terminal is open, and to which the present invention is applied.

FIG. 1 shows the principle of the present invention. In the drawings, like reference numerals are used to identify like constituents as in the prior art example described already. In the drawings, the transistor 1 as an example of the semiconductor devices has the gate terminal 4 as the control terminal and the source terminal 3 as one of the main terminals. Although these terminals 4 and 3 can be externally accessed, the drain terminal as the other main terminal is not externally accessed and is open on the device as represented by 2A (indicated by dotted line), for example. In order to check the so-called "transistor operation" of this transistor 1, such as a switching operation or an amplification operation, it is necessary to electrically connect the drain terminal, which is kept open, to the outside.

In accordance with this embodiment, a ramp voltage whose dv/dt is substantially constant is applied from outside through an electrostatic capacitance that exists in the proximity of the drain terminal, in order to electrically close the circuit through the drain terminal which is in the electrically isolated state. A ramp voltage generator 8 is positioned close to the drain of the transistor 1 through a connection terminal 7. Since a dielectric having electrostatic capacity $C_s$ exists between the terminal 7 and the drain, a displacement current is caused to flow from the terminal 7 to the transistor 1 due to electrostatic induction, and a circuit is constituted and closed between the members 8 - 7 - 1 - 3 during the rise of a ramp voltage $V_{DS}$.

When a voltage $V_G$ is applied to the gate terminal 4 during the rise of this ramp voltage, the transistor 1 changes from OFF to ON and a change occurs in the current $i_D$. The ON-OFF operation or amplification operation of the transistor 1 can be tested by studying this change.

Figure 4:
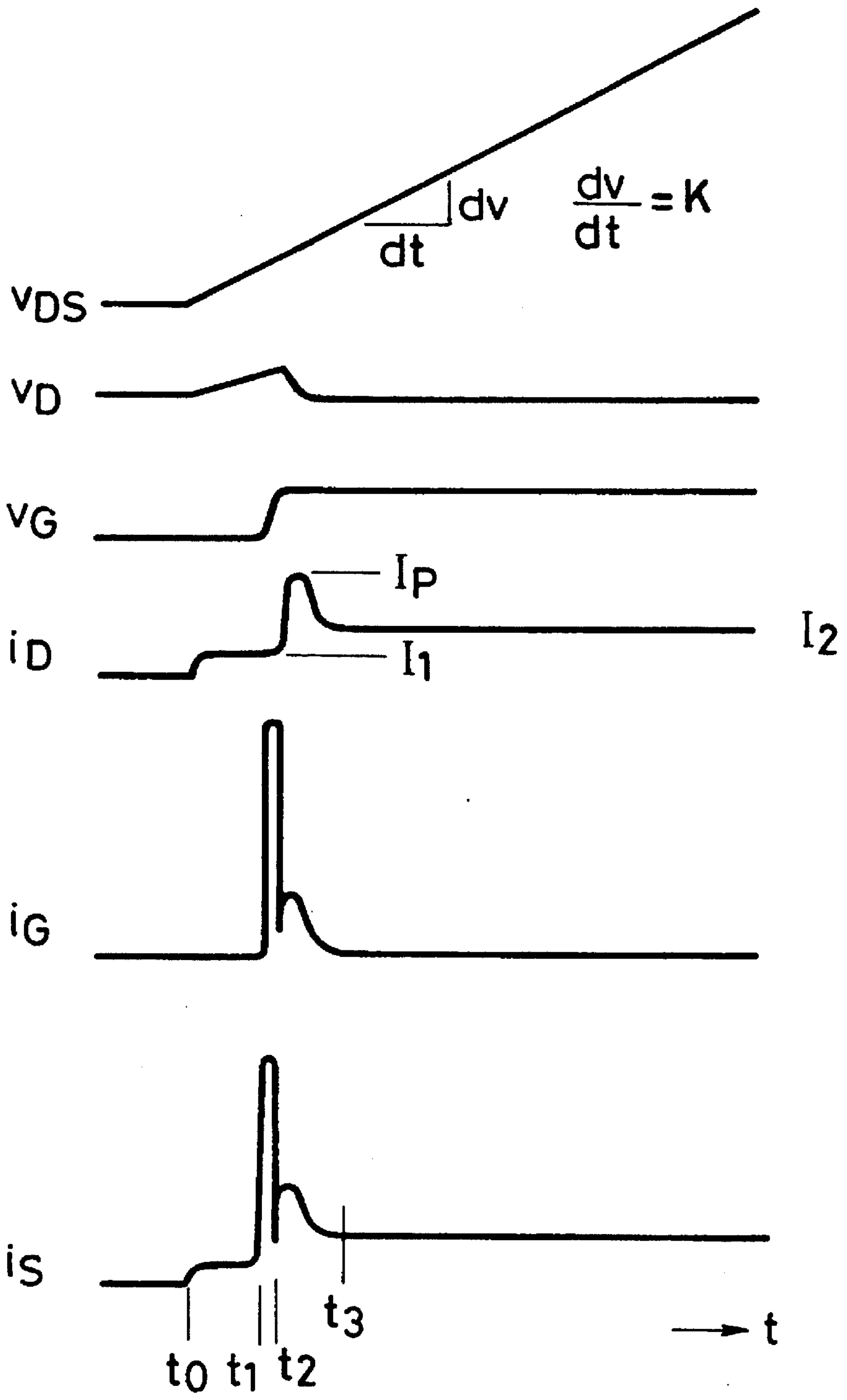
FIG. 4 is a time chart showing typical waveforms in the diagram of the principle shown in FIG. 1.
Figure 5:
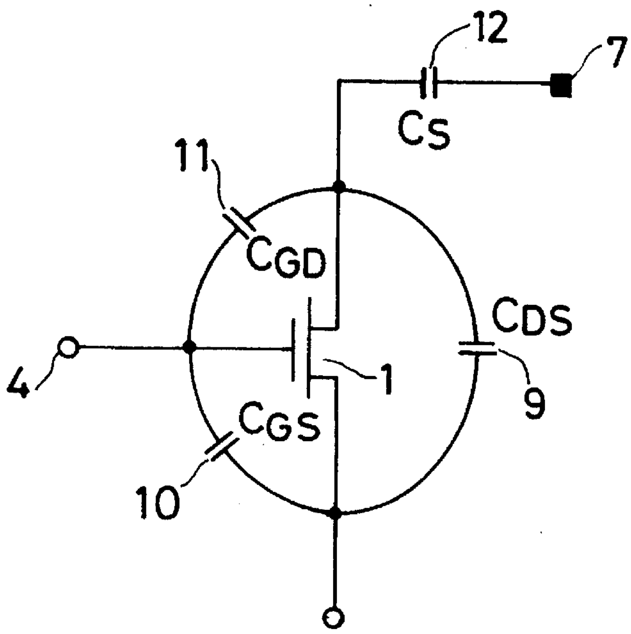
FIG. 5 is an equivalent circuit diagram when the present invention is applied to a transistor.
Figure 6:
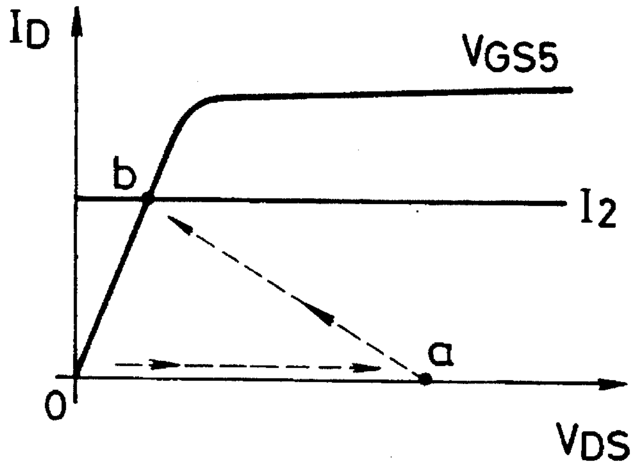
FIG. 6 is a time chart useful for explaining the operation point of the equivalent circuit.

FIG. 4 shows the waveforms of the principle of the present invention, FIG. 5 shows an equivalent circuit of the transistor for the purpose of explanation of the operation and FIG. 6 shows the transistor operation, particularly the shift of its operation point.

When the rise of the ramp voltage $V_{DS}$ starts at a time $t_0$, the current $i_D$ rises from O and reaches a certain constant value $I_1$. The current $I_1$ is generated in order to charge electrostatic capacitances $C_S$, $C_{DS}$, $C_{GD}$ and $C_{GS}$. Here, symbols $C_{DS}$, $C_{GD}$ and $C_{GS}$ represent the electrostatic capacitances between the drain and source, between the gate and drain and between the gate and source of the transistor, respectively. The current $I_1$ can be given by the following equation with K representing the value dv/dt at the rise of the ramp voltage $V_{DS}$:

$$I_1 = K \cdot \frac{C_s \cdot C_T}{C_s + C_T} \tag{1}$$

Symbol $C_T$ is an electrostatic capacitance representing the transistor, and has the following value:

$$C_T = \frac{C_{DS} \times \frac{C_{GD} \cdot C_{GS}}{C_{GD} + C_{GS}}}{C_{DS} \times \frac{C_{GD} \cdot C_{GS}}{C_{GD} + C_{GS}}} \tag{2}$$

The current $I_1$ continues till the time $t_1$. When the voltage $V_G$ is applied to the gate electrode at the time $t_1$, the transistor 1 changes from OFF to ON. In other words, the voltage $V_{DS}$ is in a sense divided by the electrostatic capacitances $C_s$ and $C_T$ in the period $t_0$ to $t_1$, and the drain voltage $V_D$ rises gradually and linearly with the rise of the ramp voltage. Therefore, the operation point of the transistor 1 shifts from the point 0 in FIG. 6 towards the point a as represented by dotted lines. At the time $t_1$, the operation point at which the transistor 1 is turned ON shifts abruptly from the point a to the point b, and the voltage $V_D$ drops as shown by the waveform $V_D$ in FIG. 4. This drop time greatly depends on the ON resistance and switching time of the transistor, and also depends on the electrostatic capacitances $C_S$, $C_{DS}$, $C_{GS}$ and $C_{GD}$ of the external circuit. Due to this fall of the voltage $V_D$, a peak current $I_P$ occurs in the current $I_D$ and substantially assumes the following value:

$$I_P = C_S \left( K + \frac{dV_D}{dt} \right) \tag{3}$$

After the ON state of the transistor 1 is completed, the peak current disappears, and the current assumes a value $I_2$. The current $I_2$ is generated in order to charge the electrostatic capacitance $C_s$, and assumes the following value:

$$I_2 = C_S \cdot K \tag{4}$$

After the time $t_3$, the operation point remains at the point b in FIG. 6, and the current $I_D$ keeps the value $I_2$.

As described above, when the ramp voltage is applied to the transistor 1 by the method shown in FIG. 1, a transient current having a waveform $i_D$ shown in FIG. 4 flows, and a change of the currents $I_p$ and $I_2$ occurs if the transistor 1 has the ON function. Therefore, the transistor operation can be tested by studying this change.

Incidentally, if the transistor 1 does not have a transistor operation and its drain-source path is open, the peak current $I_P$ and the current $I_2$ do not appear even if the gate voltage is applied and the current $i_D$ keeps a current substantially equal to $I_1$. If the drain-source path is short-circuited, the current $I_2$ flows from the beginning and the current does not substantially change even if the gate voltage is applied. For these reasons, the test becomes possible by checking the $I_P$ portion of the waveform $i_D$ or the difference between $I_2$ and $I_1$ (more definitely, the difference or ratio).

The description given above uses $i_D$ as a representative example of the current waveforms, but the source current $i_S$ or the gate current $i_G$ may also be used for the test instead of $i_D$. In other words, since the current $i_G$ and $i_S$ flow as represented by the waveforms shown in FIG. 4, it is easy to study the portions corresponding to $I_p$, $I_1$, $I_2$ of the current $i_D$ and the like by the waveforms $i_G$ and $i_S$. As will be described elsewhere, the test by use of the current $i_S$ also provides the advantage that a plurality of matrix structure devices can be tested simultaneously.

Though the description given above uses the ramp voltage $V_{DS}$ having the positive dv/dt value, a waveform having a negative dv/dt value can also be used. In such a case, desired detection can be made by grounding the drain and applying the voltage to the source.

Figure 7:
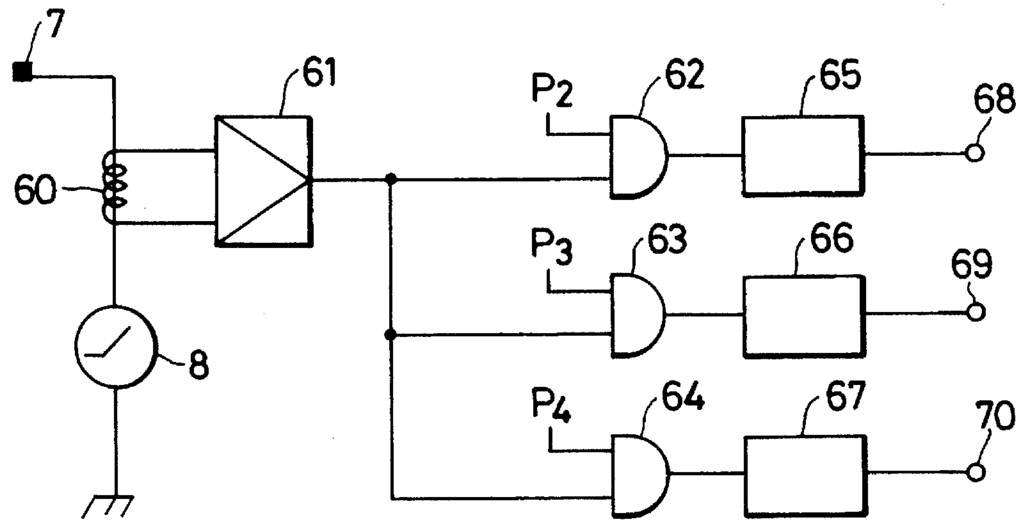
FIG. 7 is a diagram showing the current detection method in an embodiment of the present invention.
Figure 8:
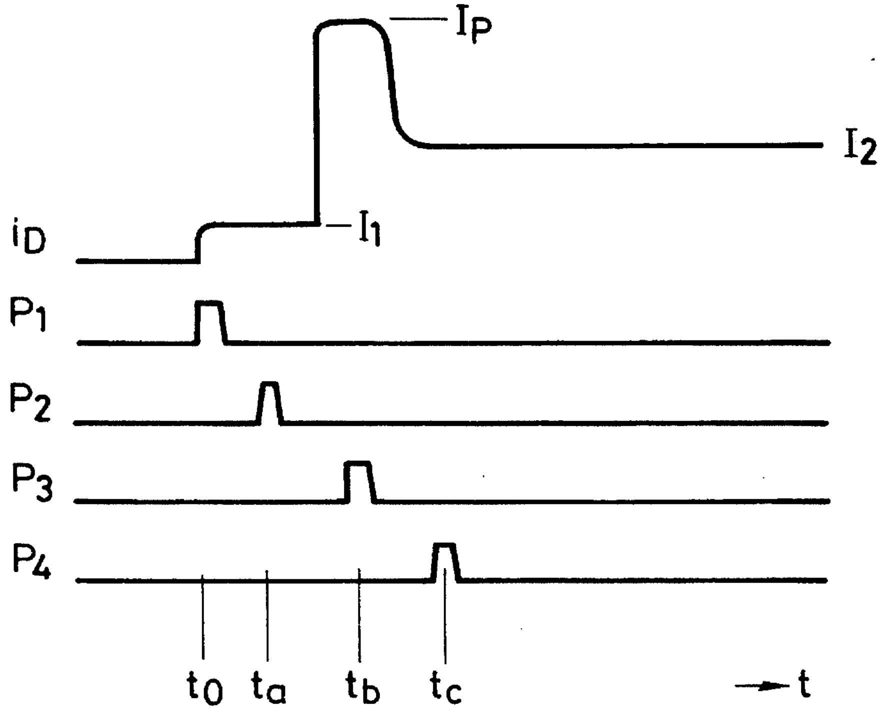
FIG. 8 is a time chart showing the waveforms at the time of current detection.

FIGS. 7 and 8 show the current detection in this embodiment. FIG. 7 depicts a measurement circuit for the current detection, and FIG. 8 depicts typical waveforms at that time. Current detection is made by a detecting element 60 (typified by a current sensor using a transformer, e.g., a Hall device). Since this signal is a low level signal, it is amplified by an amplifier 61 to a signal $i_D$ such as shown in FIG. 8. The change of the current $i_D$ starts with the time $t_0$ as the reference and is generally in synchronism with the rise (or fall) of the clock pulse $P_1$ of the system. The current $i_D$ is led to the inputs of gate circuits 62, 63 and 64. Selection signals $P_2$, $P_3$, $P_4$ are applied to the gate devices, respectively, and each signal is prepared from the clock pulse $P_1$ as shown by the waveforms in FIG. 8 and is generated at the time $t_a$, $t_b$, $t_c$. When the pulse $P_2$ is generated at the time $t_a$, the gate 62 is opened, and detects the value of the current $i_D$ at the time $t_a$, that is, $I_1$, as the output signal. The peak value of this signal is detected by a peak detection circuit 65, reaches the level of the current $I_1$ and appears at the output terminal 68 while continuously keeping that level.

Peak detection is effected in the same way for the pulses $P_3$, $P_4$, and the current $I_P$ appears at the output terminal 69 while the current $I_2$ appears at the output terminal 70 due to the operation of the peak detection circuits 66, 67.

The signals $I_1$, $I_2$, $I_P$ thus obtained can be used as the signals for the test.

Figure 9:
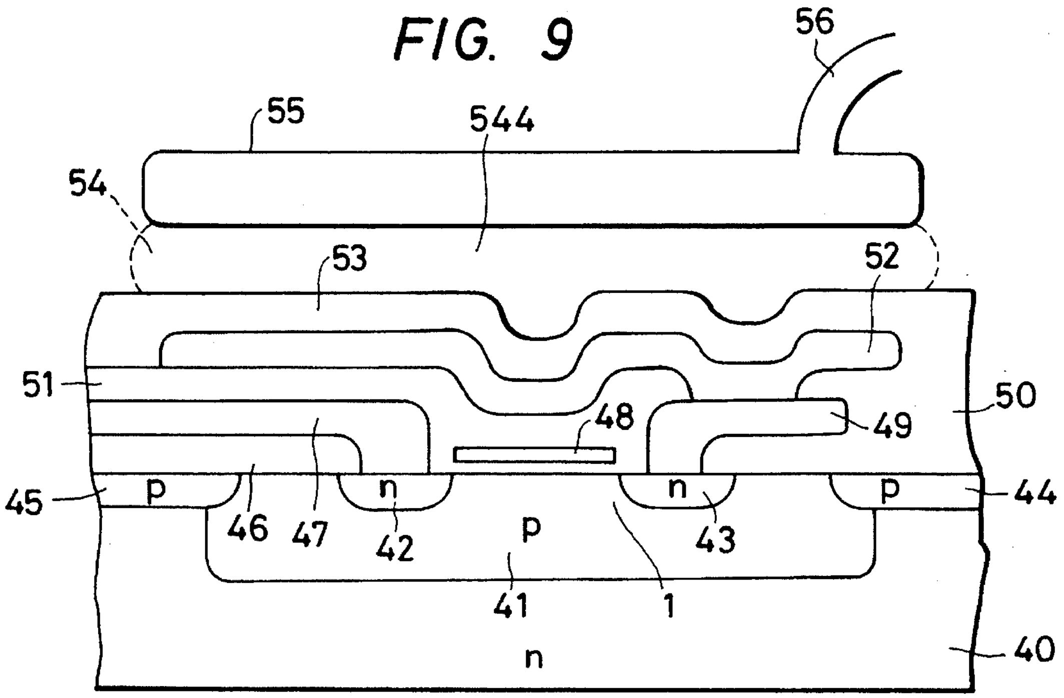
FIG. 9 is a sectional view showing a definite embodiment of the present invention.

A definite embodiment of the present invention will now be described with reference to FIG. 9. FIG. 9 shows an example where the present invention is applied to an MOS transistor 1 whose drain terminal is not extended to the outside. The transistor 1 is fabricated in an integrated circuit (IC). The transistor 1 is fabricated by forming a p-type region (which is generally referred to as a "well") 41 inside an n-type substrate 40, then forming n-type regions 42, 43 in this p region and using the n region 42 as the source and the n region 43 as the drain. P regions 44, 45 are channel stoppers for stabilizing the transistor operation.

Extension of the drain and source electrodes of the transistor 1 is made by use of conductors (generally, aluminum) 47, 49, and the electrode 47 is extended to the outside. The gate 48 for the transistor 1 is disposed on the p layer 41, and is encompassed by a dielectric (generally, silicon dioxide $SiO_2$) 51. The gate terminal is extended to the outside (not shown in the drawing).

A pixel electrode 52 consisting of a heretofore known transparent conductive film extends on the drain 49 in a wide area, and dielectrics 53 and 50 are disposed on the upper and side surfaces of the pixel electrode 52 in such a manner as to cover the electrode 52. The conductor 52 at these portions are not extended to the outside as the electrode. This device is used as a device for display. A display member such as a liquid crystal, an EL or the like is disposed in a space 54 above the dielectric 53 to provide the display function such as LCD, EL, ECD, PDP, and so forth.

When the present invention is practised in the device described above, an electrode 55 (which has the function of a connection terminal 7) is disposed in such a manner as to face the device, and a ramp voltage is applied to a terminal 56 in order to generate a circuit between it and the internal electrode conductor 52 through the space 54. Though the electrode 55 is shown two-dimensionally in the drawing, it is actually three-dimensional and expands in a direction perpendicular to the sheet of the drawing. Preferably, this electrode 55 is disposed in such a manner as to face the area of the drain electrode 52 and, if possible, it is preferred to use a form which covers the electrode 55. The space 54 is preferably as narrow as possible, and is preferably under a contact state.

This embodiment makes it possible to conduct the test with a high level of accuracy by use of the relatively simple electrode 55 and by reducing the gap of the space 54. If an auxiliary member 544 such as a conductor (such as mercury) or a dielectric having a high dielectric constant (such as a liquid crystal) is interposed in the space 54 as represented by dotted lines, the test sensitivity can be improved and the electric constant of the terminal 55 can be enhanced.

Figure 10A:
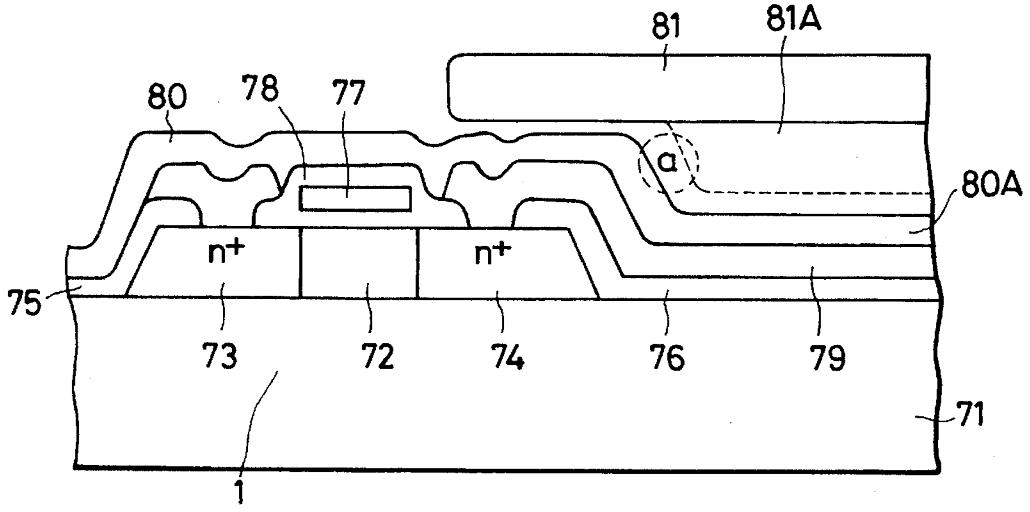
FIGS. 10(*a*)–10(*b*) are sectional and plan views showing another embodiment of the present invention.
Figure 10B:
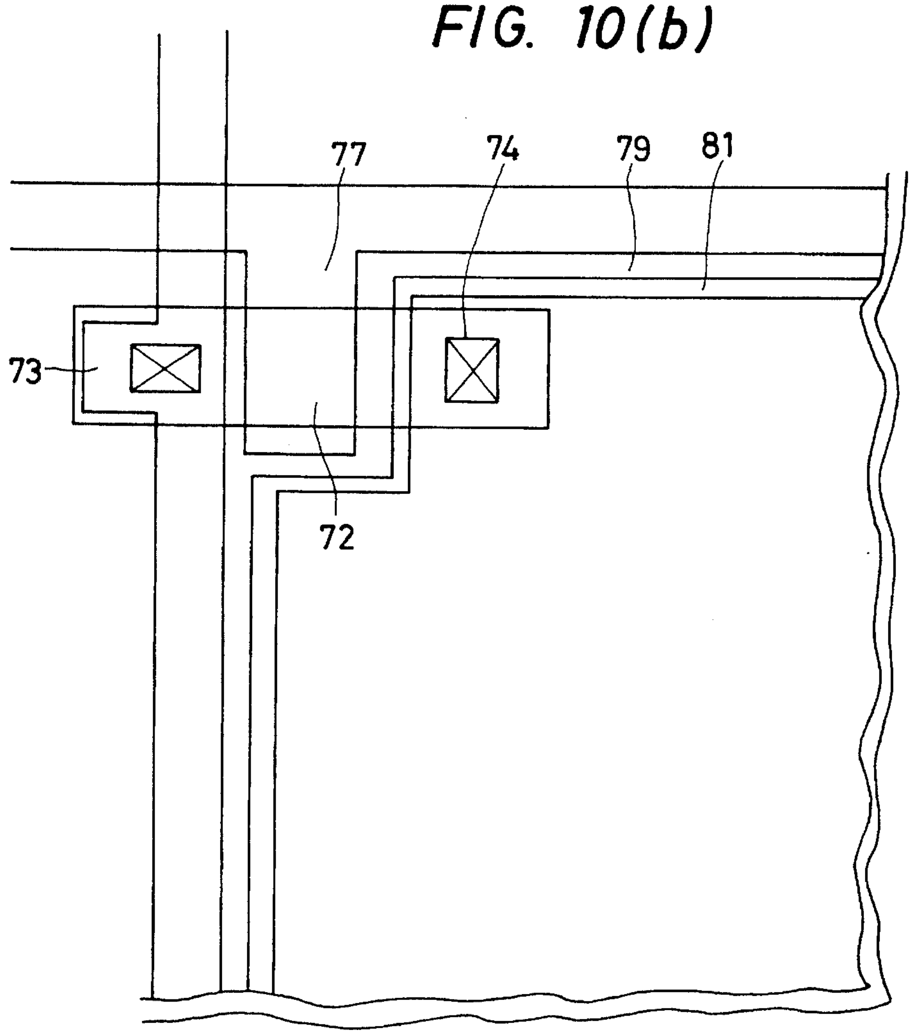

FIG. 10(*a*) is a sectional view of another embodiment of the present invention, and FIG. 10(*b*) is a schematic plan view of FIG. 10(*a*). In this case, the transistor 1 consists of an n-type region 73 as the source, an n-type region 74 as the drain, a region 72 made of an intrinsic semiconductor and a gate electrode 77. In comparison with the foregoing embodiment, the transistor of this embodiment is different in that the device itself is formed on the dielectric 71, and a material such as glass, sapphire, plastics or the like is generally used as the dielectric 71. In other words, this device is formed by forming first the region 72 in a wide range on the upper surface of the glass or the like, then forming two n-type regions 73, 74 by thermal diffusion, ion implantation or the like, fitting the electrodes 77, 79 to the regions 73, 74 and covering the gaps between them by isolation films 75, 78, 76, 80. A typical example of this device is an active matrix system film transistor device which seals a display member such as a liquid crystal or EL into the upper surface and uses it as a display.

In the device of this type, the drain electrode 79 is extended in a wide range (that is, in a wide area) and is then sealed off. A display member such as a liquid crystal is disposed and sealed on this electrode, and a voltage is applied to the display member from the electrode 79, thereby realizing a display. In this case, the drain electrode is under the seal-off state and the terminal is not extended to the outside. When the present invention is applied to such a device, a circuit is formed between the transistor 1 and an electrode 81 by utilizing dielectric induction between these electrodes 79 and 81 in the same way as described already, and the test can be conducted.

Generally, the insulating film 80A of the portion (corresponding to the right side portion of the electrode 79 in the drawing) used for the display in the device of this type is mostly lower than the other portions of the device. Therefore, the accuracy of current detection is sometimes lower if the shape of the electrode 81 remains unchanged. For this reason, an electrode 81A having a projection as represented by dotted lines in the drawing is formed so as to reduce the distance between the electrodes 81A and 79. According to this construction, the accuracy of detection can be improved and registration of the electrode 81 to the transistor 1 becomes easier. This is because the side surface of the electrode 81A can be easily registered to the side surface of the insulating film 80 in the region a.

Figure 14:
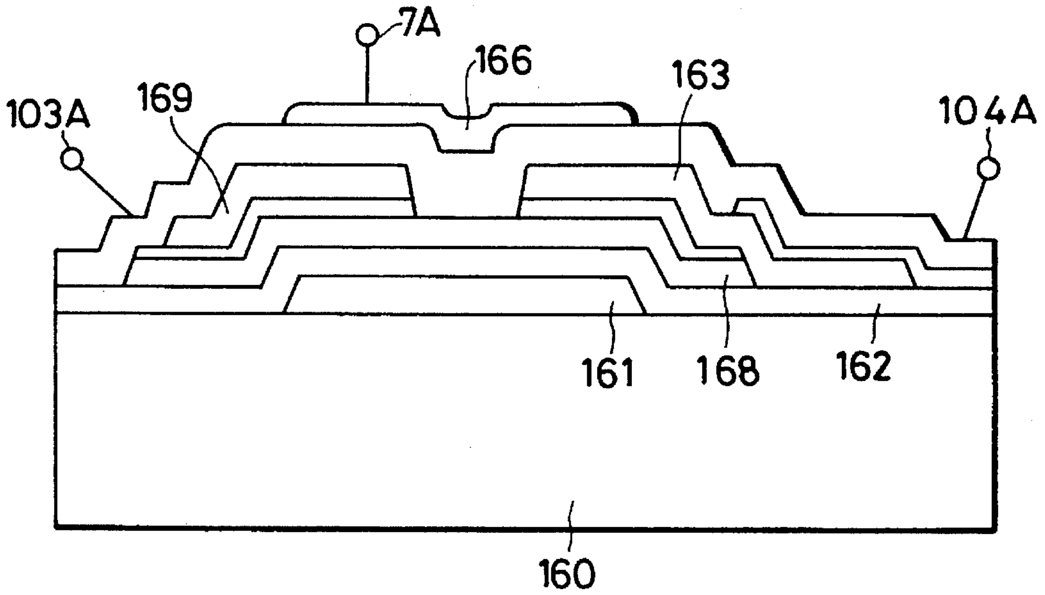
FIG. 14 is a sectional view showing still another embodiment of the present invention.

FIG. 14 shows a modified embodiment of the present invention. In this device, a gate electrode 161 is disposed on a glass substrate 160 and is covered with a silicon nitride film 162. Furthermore, amorphous silicon 168 is disposed on the film 162, and a source electrode 169 and a drain electrode 163 are extended from both ends of silicon. These electrodes are covered with the silicon nitride film 162, and a shading film 166 is disposed further thereon to cut off external light.

Figure 11:
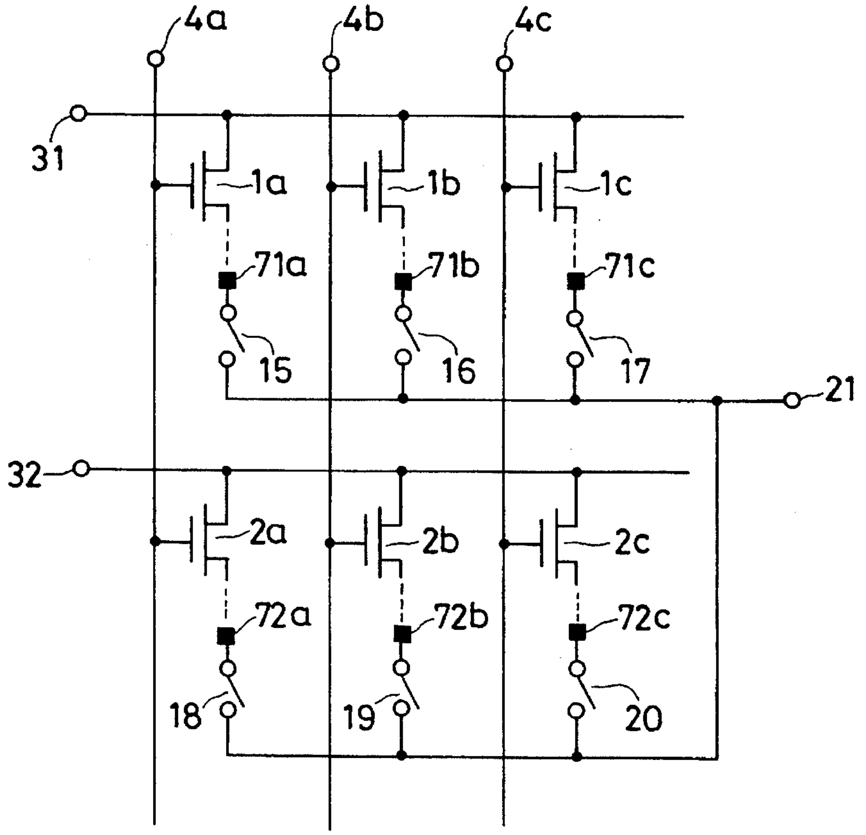
FIG. 11 is a circuit diagram showing another embodiment of the present invention.

Such a device structure is often employed in a flat display using amorphous silicon. A gate terminal is extended as 104A from the gate electrode 161 and a source terminal is extended as 103A from the source electrode 169 to the outside. The portion corresponding to the terminal 7 shown in FIG. 11 is substituted by disposing a terminal 7A to the shading film 166. In order words, this modified embodiment does not use the external terminal 7 for causing the dielectric induction, but uses the shading film 166 having electric conductivity in place of the electrode 7. The voltage $V_{DS}$ represented by the waveform shown in FIG. 4 is applied to the terminal 7A, the terminal 103A is set to the ground level voltage and the voltage $V_G$ is applied to the terminal 104A to test the function of the transistor using amorphous silicon 168.

In this embodiment, there is no need for directing the terminal 7 towards the transistor for probing and the test work becomes easier. In a device which uses the structure shown in FIG. 14 as a matrix structure, the device test can be made easily by disposing the shading film 166 on the scanning side of the matrix structure or along the electrodes on the side of the signal source in addition to the original shading function.

FIG. 11 shows still another embodiment of the present invention. This embodiment tests the transistor operation for those transistors 1*a*, 1*b*, 1*c*, 2*a*, 2*b*, 2*c* which are wired in matrix. The sources of the transistors 1*a*, 1*b*, 1*c*, . . . of the first row are connected to one another to form first signal lines, and is extended outside as a terminal 31. The method of leading out the source terminal is the same for the other rows and a plurality of second signal lines are constituted as terminals 32, . . . , . The gates of the transistors 1*a*, 2*a*, . . . of the first column are connected to one another to form the first signal line, and this signal line is led out as a terminal 4*a*. Similarly, terminals 4*b*, 4*c* are led out for the other columns.

In order to operate such a device, a signal is applied to one of the row terminals 31, 32 (or the terminal is grounded) and, at the same time, a signal is applied to one of the column terminals 4*a*, 4*b*, 4*c*, . . . to turn on one of the transistors. In other words, so-called "line sequential driving" or "dot sequential driving" is mostly employed.

In order to test the device having such a matrix structure, the electrodes 71*a*, 71*b*, 71*c*, . . . , 72*a*, 72*b*, 72*c*, . . . are brought close to the drain electrodes open for the transistors and are wired to the terminal 21 through the switches 15, 16, 17, . . . 18, 19, 20. When the transistor 1*a* is to be tested, only the switch 15 is closed while all the others are kept open and the terminal 31 is grounded. Under this state, the ramp voltage is applied to the terminal 21, and the pulse signal is applied to the gate terminal 4*a* during the rise period of this voltage to turn off the transistor 1*a*. The transistor 1*a* can thus be tested by checking the current flowing through the terminal 21 in the same way as in the embodiments described already. The other transistors can be likewise tested by opening and closing the switches and selecting the terminals.

This embodiment provides the effects that a large number of transistor devices can be tested at the same time, and that only one circuit is necessary as a detection circuit if the current is detected at the ground terminal 31. On the other hand, if the electrodes 71*a*, 71*b*, . . . are fabricated as one jig, the registration of the electrodes can be made more easily than the embodiments described already.

Figure 12:
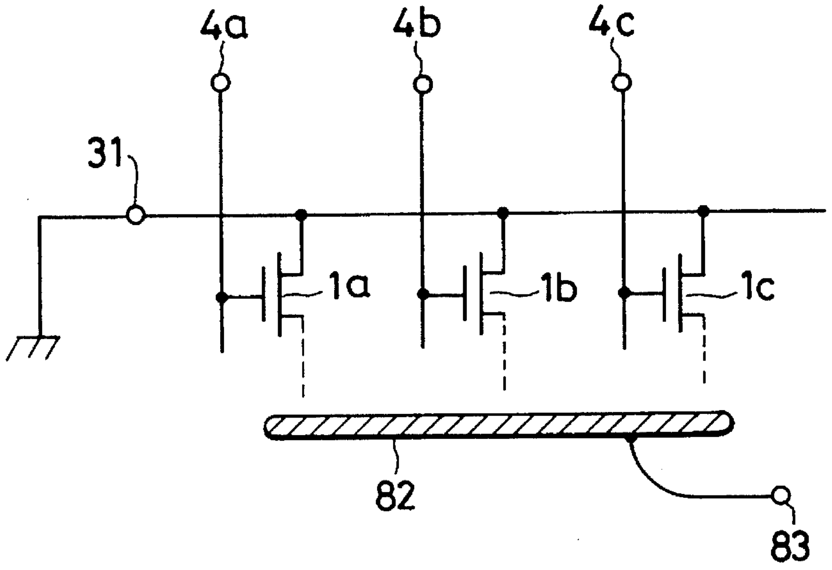
FIG. 12 is a circuit diagram showing a modified embodiment of FIG. 11.

FIG. 12 shows still another embodiment of the present invention. In this embodiment, only one electrode 82 is disposed for the transistors 1*a*, 1*b*, 1*c* of the matrix structure and the switches are omitted. In this case, the terminal 31 is grounded and the ramp voltage is applied to the terminal 83. In the meantime, the pulses are simultaneously applied to the terminals 4*a*, 4*b*, 4*c* to turn on the transistors and the current flowing through the circuit is checked. Since a current which is three times the current under the normal operation state flows through the circuit in this case, the function of the transistors 1*a*, 1*b*, 1*c* can be checked consequently. It is not always necessary to simultaneously apply the pulses to the terminals 4*a*, 4*b*, 4*c*. In other words, the pulse may be applied separately and the current may be checked at each time. This method is effective when the number of transistors 1*a*, 1*b*, 1*c*, . . . becomes great.

In other words, in the active matrix substrate using the display member such as the liquid crystal or EL, the opposed electrode corresponds to the electrode 82 under the state where the opposed electrode for sealing the display member is fitted, and if a detector is connected to each terminal of the electrode 31 corresponding to a large number of signal electrodes, all the transistors in the active matrix can be tested.

Figure 15:
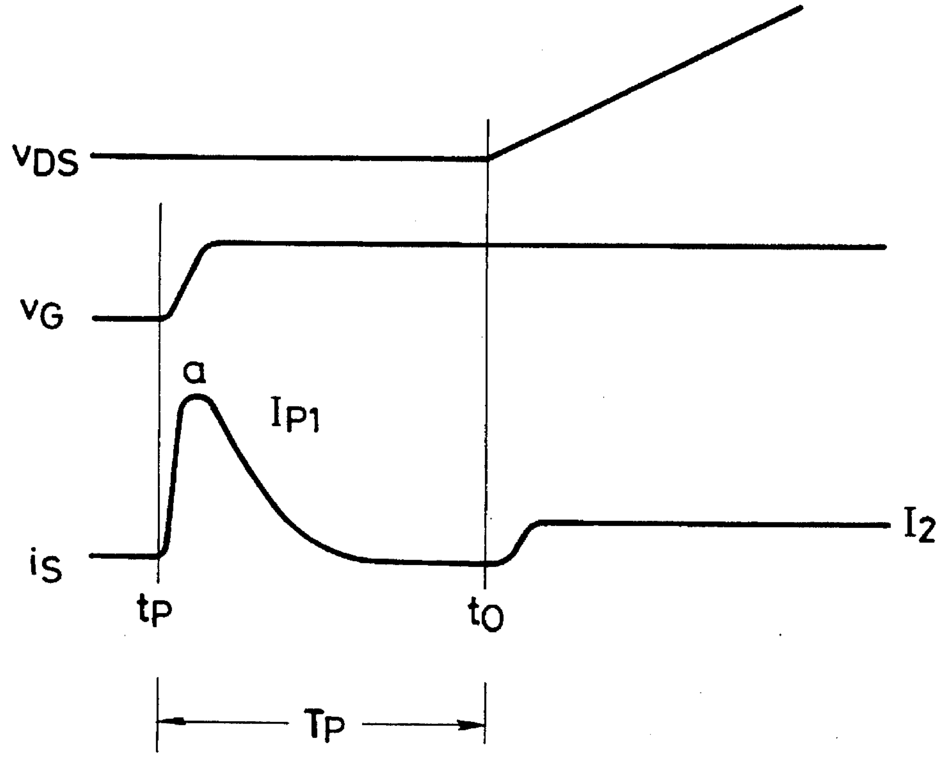
FIG. 15 is a time chart showing another embodiment of the testing method of the present invention.
Figure 16A:
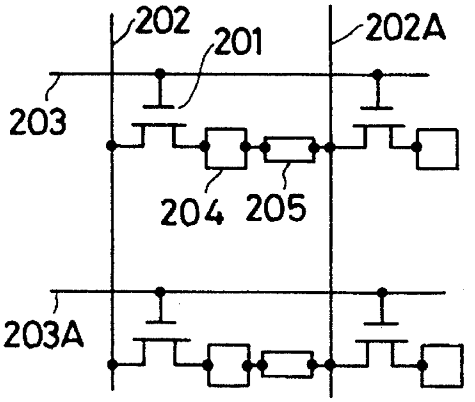
FIGS. 16(*a*)–16(*d*) are circuit diagrams showing the fundamental constructions of a display device of the present invention.
Figure 16B:
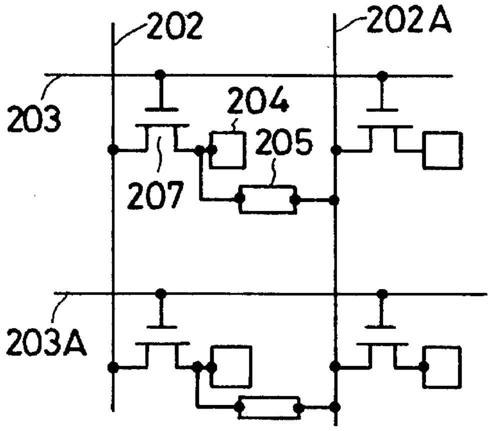
Figure 16C:
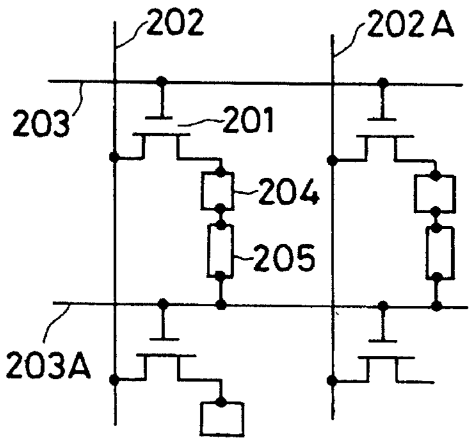
Figure 16D:
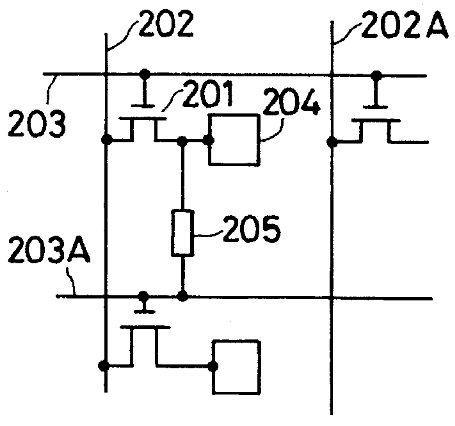

FIG. 15 shows still another embodiment of the present invention. In this embodiment, the gate voltage $V_G$ is applied in advance earlier than the rise portion of the voltage $V_{DS}$ in order to reduce the influences of $I_P$ due to the rise of the voltage $V_G$ at the time of detection of the current value $I_2$.

The gate signal $V_G$ is applied at a time $t_P$ earlier than the rise portion (at the time $t_0$) of the ramp voltage $V_{DS}$. At this time, the influence of the rise portion of the voltage $V_G$ on the current $i_S$ appears as the peak $I_{P1}$, and this current descreases with time and reaches substantially O at the time $t_0$. In other words, if a long time is selected as the time $T_P$, the peak portion a can be distinguished from the switch current $I_2$. Since this method makes it possible to detect the current $I_2$ immediately after the time $t_0$, the test time does not become lengthy.

Figure 13:
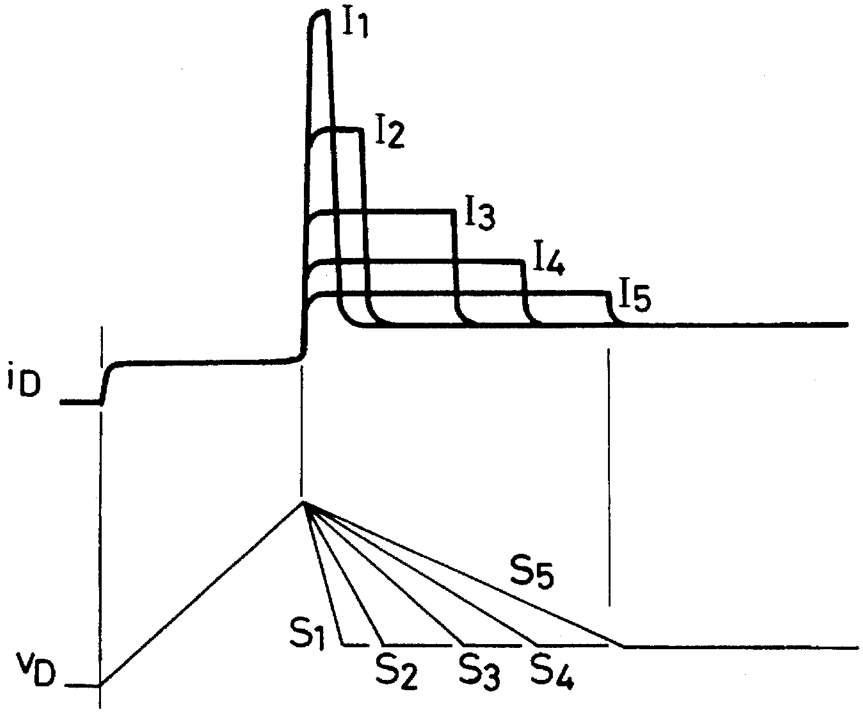
FIG. 13 is a time chart useful for explaining the effect of another modified embodiment of the present invention.

FIG. 13 is an explanatory view useful for explaining another modified embodiment of the present invention. This waveform illustrates that the ON resistance of the transistor can be checked in accordance with the present invention. When the ON resistance of the transistor is small, the peak current becomes great such as represented by the waveforms $l_1$, $S_1$. Since the signal is applied to the gate of the transistor and the transistor is turned ON, the source and drain of the transistor can be approximated to one resistor, so that the fall $S_1$ of the waveform $V_D$ drops in the time determined substantially by the product of this resistance value and the electrostatic capacitance $C_s$. Therefore, the smaller the ON resistance $S_1$, the more rapidly $S_1$ falls and the greater becomes the current $l_1$. As the ON resistance value becomes greater, the voltage waveform $V_D$ changes from $S_1 \rightarrow S_2 \rightarrow S_3 \rightarrow S_4 \rightarrow S_5$ while the current waveform $i_D$ changes from $l_1 \rightarrow l_2 \rightarrow l_3 \rightarrow l_4 \rightarrow l_5$. Therefore, the degree of the ON resistance value of the transistor can be tested by checking the state of the peak of the waveform $i_D$ (i.e. the peak value and its duration time).

When the switching time of the transistor changes with the ON resistance remaining constant, too, the waveform is substantially equal to the one shown in FIG. 13, so that the length of the switching time can also be tested.

In the embodiments described above, the form of the transistor is of a field effect type represented by a unipolar transistor, but the present invention can of course be practised in the case of ordinary bipolar transistors. Though the foregoing embodiments illustrate the case where one of the drains of the transistor is open, the present invention can applied also to the case where not only one of the drains but also the source of the transistor are open. In such a case, the ramp voltage having a positive dv/dt value is applied to the drain while the ramp voltage having a negative dv/dt value is applied to the source substantially simultaneously with the former so as to detect the current.

Though the foregoing embodiments illustrate the case where the ramp voltage is used as the voltage to be applied from outside, the voltage need not always be the ramp voltage from the aspect of utilization of the electrostatic induction. Therefore, it is also possible to use other voltages which change with time, such as voltages having a sine waveform, a parabola waveform, and the like.

Next, the display device in accordance with the present invention will be described in detail. In ordinary active matrix displays, the present invention wires electrically a display electrode consisting of a transparent electrode, which is kept open before the seal of a display member, to other wirings by resistors, capacitors or the like, and measures and tests the characteristics of semiconductor switching devices and the state of the wirings.

FIGS. 16(*a*) through 16(*d*) are circuit diagrams showing one embodiment of the display device of the present invention.

FIG. 16(*a*) shows the structure of one pixel of a display portion. In this drawing, the display device consists of a TFT device 201 as a semiconductor switching device, signal electrodes 202, 202A, scanning electrodes 203, 203A, a pixel electrode 204 consisting of a transparent electrode such as ITO (Indium Tin Oxide), and a device 205 as means for applying a voltage from the signal electrode 202A to the pixel electrode 204 consisting of the resistor, capacitance of the like.

FIG. 16(*b*) shows another embodiment. This embodiment is different from the embodiment of FIG. 16(*a*) in that the device 205 is directly connected to the source electrode as the terminal electrode of the TFT device 201. For purpose of description, the electrode of the TFT device 201 connected to the signal electrode 202 and the electrode connected to the pixel electrode will be hereby referred to as the "drain electrode" and the "source electrode", respectively.

FIG. 16(*c*) shows still another embodiment. The difference of this embodiment from the embodiment shown in FIG. 16(*a*) lies in that the device 205 is connected to the signal electrode 203A.

FIG. 16(*d*) shows still another embodiment. The difference of this embodiment from the embodiment shown in FIG. 16(*c*) lies in that the device 205 is interposed between the source electrode as the terminal electrode of the TFT device 201 and the signal electrode 203A.

In the embodiments shown in FIG. 16, it is the role of the device 205 to form an electric circuit between the signal electrodes 202 and 202A, to measure and check the characteristics of the TFT device 1 and to detect any defect of the signal electrodes 202, 202A or the scanning electrode 203 such as breakage, short-circuit and the like, in the cases of FIGS. 16(*a*) and 16(*b*).

In the cases of FIGS. 16(*c*) and 16(*d*), the device 205 plays the role of forming an electric circuit between the signal electrode 202 and the scanning electrode 203A and realizing the same operations as described above.

Here, various devices can be used as the device 205. As will be illustrated in the later-appearing embodiments, when the display device is operated after the sealing of a display member such as a liquid crystal or EL, a heretofore known driving method can be used by the connection of the device 205.

Figure 17:
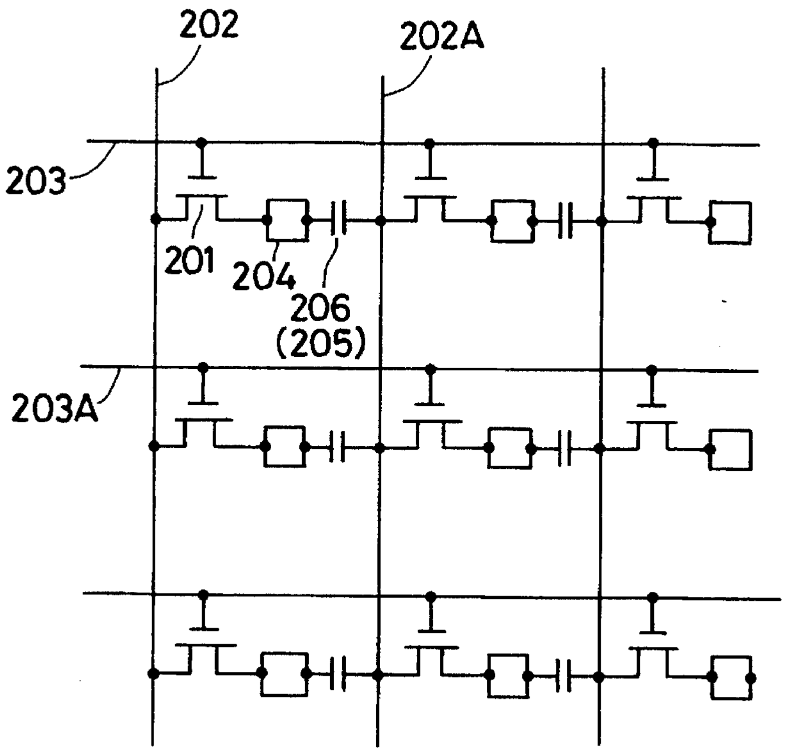
FIGS. 17, 24, 27 and 29 are circuit diagrams showing definite examples of the display device of the invention.
Figure 18:
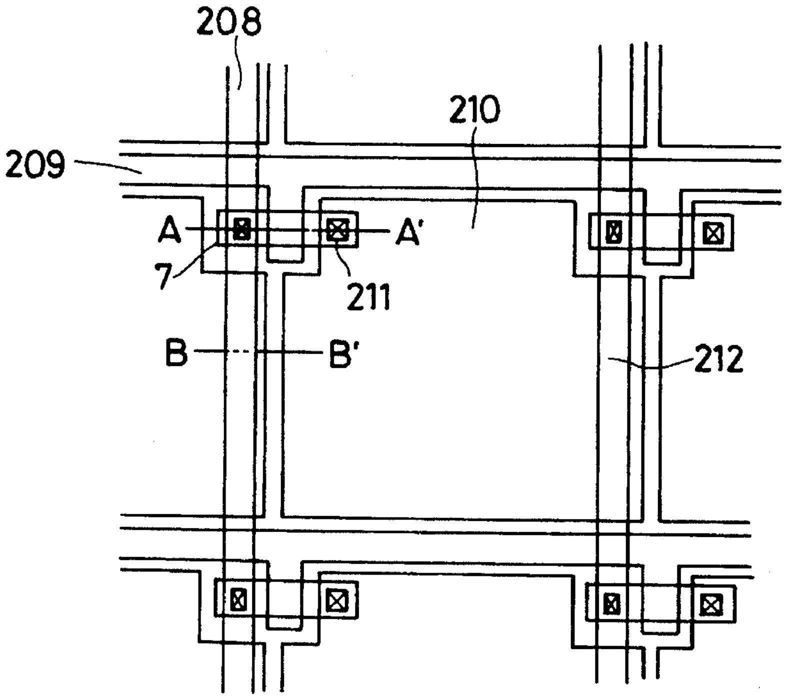
FIGS. 18, 26 and 32 are plan views showing the planar structure of one pixel.

FIG. 17 shows a structure which uses an electrostatic capacitance 206 as the device 205 of FIG. 16(*a*). In comparison with the conventional structure in which the electrostatic capacitance 206 does not exist, this structure can be produced without increasing the production steps in particular. FIG. 18 shows a structure which realizes the circuit shown in FIG. 17. In the drawing, one pixel consists of a semiconductor film 207 such as a polycrystalline silicon film, an amorphous silicon film or a thermally recrystallized silicon film, a drain electrode 208 of a TFT device which serves also as a signal electrode, a gate electrode 209 of the TFT device which serves also as a scanning electrode, a display electrode 210 formed by a transparent electrode material such as ITO and a contact hole 211. In this pixel, the electrostatic capacitance is formed by superposing the signal electrode 208 and the pixel electrode 210 at the portion 212 on the signal electrode.

Figure 19A:
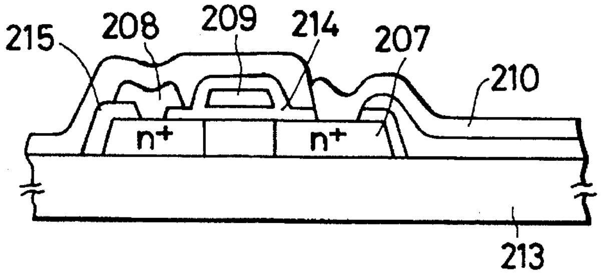
FIGS. 19(*a*)–19(*b*) are a sectional views taken along lines A—A' and B—B' of FIG. 18.
Figure 19B:
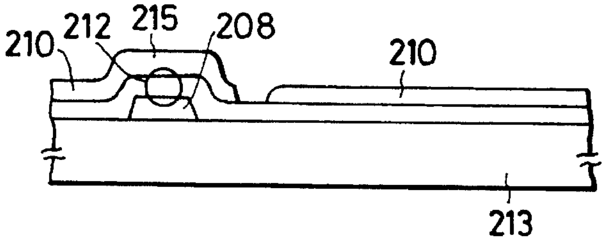

FIGS. 19(*a*) and 19(*b*) are sectional views taken along lines A—A' and B—B' in FIG. 18, respectively. The sectional structure along line A—A' is exactly the same as a heretofore well known TFT structure. In the sectional structure taken along line B—B', on the other hand, the electrostatic capacitance 212 is formed between the transparent pixel electrode 210 and the signal electrode 208 using a passivation film such as $SiO_2$, PSG or the like for protecting the TFT device as an insulating film. According to this structure, there is no need to particularly introduce any new production process in order to form the electrostatic capacitance, and the device can be obtained by only changing the photomask pattern. Therefore, the display device can be produced without increasing its cost of production.

The principle of operation of the embodiment having the construction shown in FIG. 17 will now be explained with reference to FIGS. 20(*a*), 20(*b*) and 21.

Figure 20A:
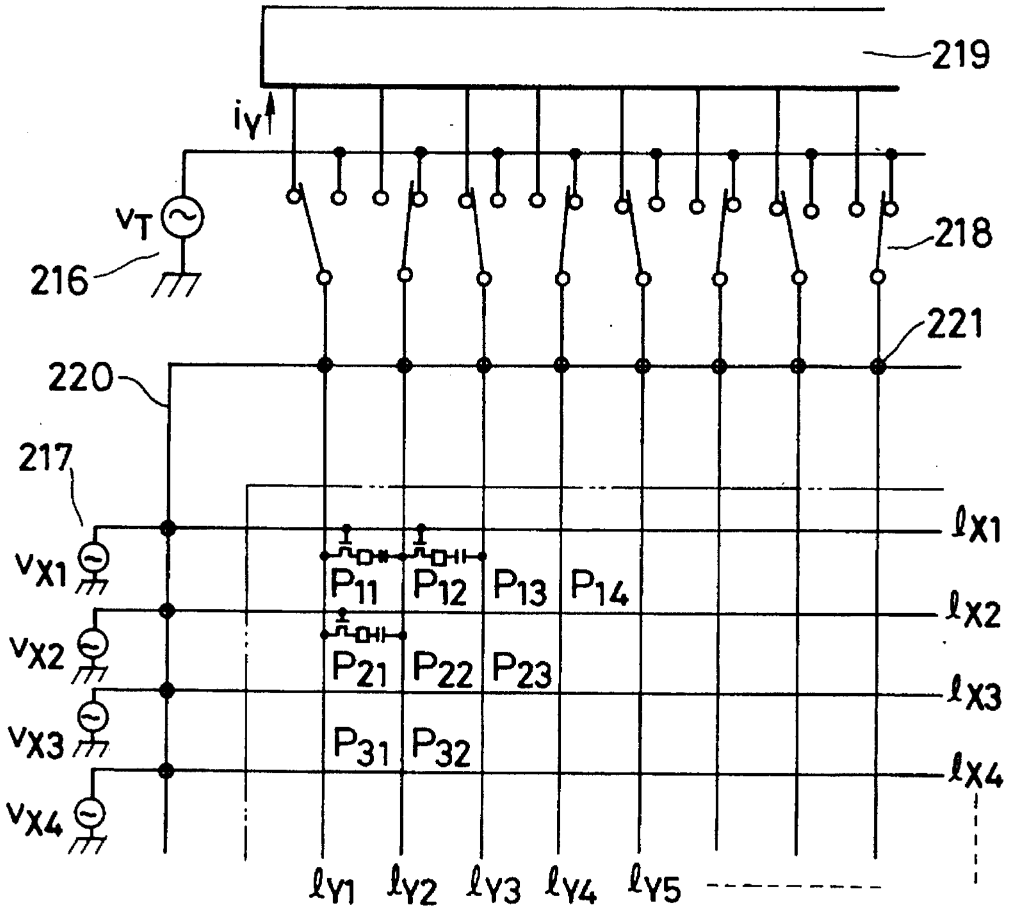
FIGS. 20(*a*)–20(*b*) and 30 are structural views showing a testing circuit.
Figure 20B:
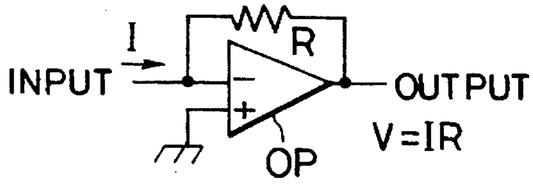

FIG. 20(*a*) shows a circuit for testing the display device, which includes a testing signal voltage source 216, a scanning voltage source 217, a switch circuit 218, a current detection circuit 219 and a display substrate 220. Symbols $l_{x1}$, $l_{x2}$, $l_{x3}$, . . . , represent scanning electrodes, and $l_{y1}$, $l_{y2}$, $l_{y3}$, . . . are signal electrodes. Symbol $P_{xy}$ represents a pixel, $V_T$ is a signal voltage for the test and $v_{x1}$, $v_{x2}$, $v_{x3}$, . . . are scanning voltages. Reference numeral 221 represents an external connection terminal portion of the display substrate 220.

These members are connected in the following manner. The circuit 217 which generates the scanning voltages $v_{x1}$, $v_{x2}$, $v_{x3}$, . . . for the scanning electrodes $l_{x1}$, $l_{x2}$, $l_{x3}$, . . . is connected to the external connection terminal portion 221 of the display substrate 220, and the circuit 216 which generates the signal voltage for the test for the signal electrodes $l_{y1}$, $l_{y2}$, $l_{y3}$, . . . through the switch circuit 218 and a signal detection circuit 219 are then wired. The switch circuit is connected in the manner shown in FIG. 20. That is, the odd-numbered signal lines $l_{y1}$, $l_{y3}$, $l_{y5}$, . . . are connected to the current detection circuit 219 while the even-numbered signal lines are connected to the testing signal voltage generation circuit 216. The current detection circuit 219 can be constituted by a resistor R and an operational amplifier OP as shown in FIG. 20(*b*), for example.

Figure 21:
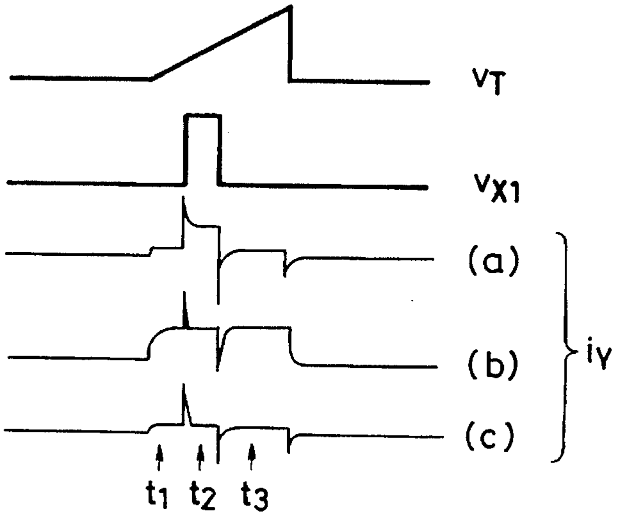
FIGS. 21, 23, 25, 28 and 31 are waveform diagrams showing the driving and output waveforms.

When the odd-numbered pixels $P_{11}$, $P_{13}$, $P_{15}$, . . . of the first row are to be tested in the circuit construction described above, the voltages having the waveforms shown in FIG. 21 are applied to their terminals, respectively. First of all, as the signal voltage $V_T$ produced from the testing signal voltage generation circuit 216, a voltage whose rise dv/dt is constant and which has a lamp-like function is applied to the terminals $l_{y2}$, $l_{y4}$, $l_{y6}$, . . . while a scanning voltage of a rectangular waveform is applied as $v_{x1}$, $v_{x2}$, . . . , . The current detected from the terminal of each signal electrode $l_{y1}$, $l_{y3}$, $l_{y5}$, . . . exhibits a different current waveform depending upon the characteristics of the TFT device as shown in FIGS. 21(*a*), (*b*) and (*c*).

The current waveforms will be explained by use of an equivalent circuit of one pixel shown in FIG. 22. When the signal voltage $V_T$ for the test is applied to the signal electrode 202A, the output current $i_Y$ is determined by the constant of each of the capacity $C_T$, the capacities $C_{gs}$, $C_{gd}$ and $C_{ds}$ that are dependent upon TFT and the resistance $R_P$ of the pixel electrode, and by the resistance $r_{ds}$ between the drain and source of TFT 1. First of all, the waveform having a lamp function, shown in FIG. 21, is applied as $V_T$. If the drain to source resistance $r_{ds}$ is sufficiently large when the gate voltage $v_{x1}$ of TFT 201 is below the threshold voltage, the current $i_Y$ is one that flows through the circuit constituted by each capacity. In this case if each capacitance of $C_{gs}$, $C_{gd}$, $C_{ds}$ is by far smaller than the capacity $C_t$, the current $i_Y$ is given by the following equation:

$$i_Y = \frac{C_t \cdot C_{TFT}}{C_t + C_{TFT}} \cdot \frac{d_{vt}}{dt} \div C_{TFT} \cdot \frac{d_{vt}}{dt}$$

Figure 22:
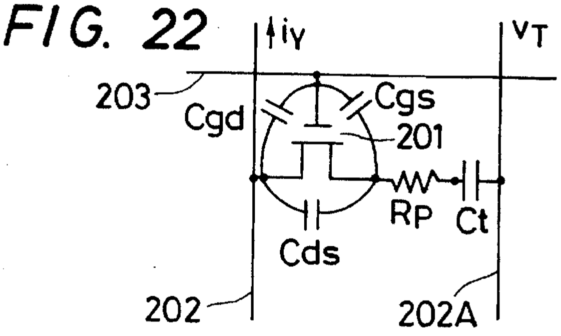

Here, $C_{TFT}$ represent the capacity of the TFT device 201 and $C_{TFT}$ in FIG. 22 is given as follows:

$$C_{TFT} = C_{ds} + \frac{C_{gd} \cdot C_{gs}}{C_{gd} + C_{gs}}$$

Next, when the scanning voltage $v_{x1}$ is above the threshold voltage of the TFT device 201 and $r_{ds}$ becomes a small value, each capacity $C_{ds}$, $C_{gd}$, $C_{gs}$ is equivalent to the short-circuit state so that $i_Y$ is given as follows:

$$i_Y = C_t \cdot \frac{d_{vt}}{dt}$$

In other words, the current $i_Y$ assumes a rising waveform when the TFT device 201 exceeds the threshold voltage $V_{th}$.

Next, when the gate impressed voltage of the TFT device 201 is reduced again below the threshold voltage and the resistance $r_{ds}$ is set to be a sufficiently great value, the level of the current $i_Y$ is equal to the initial state and hence drops. On the other hand, a defect occurs which always renders the drain-source of the TFT device 1 to a low resistance irrespective of the value of the gate voltage, the current $i_Y$ having a large value flows during the application of the signal voltage $v_t$ as shown in FIG. 21(*b*). In contrast, if the drain-source always remains at high resistance irrespective of the value of the gate voltage, the current $i_Y$ is always at a low level. In other words, the output pulse is sampled at each time $t_1$, $t_2$, $t_3$ shown in FIG. 21 and each level is compared in order to judge the characteristics of the TFT device 201. In addition, the drain-source resistance $r_{ds}$ of the TFT device 201 can be measured by accurately measuring the levels of the waveform of the current $i_Y$.

In accordance with this method, the test of the odd-numbered pixels of the first row is completed. Thereafter, each switch of the switches 218 in FIG. 20 is set to the opposite side, and the even-numbered pixels are tested in the same measurement method, as above. That is, the test of the row of the display portion is completed by two measurements. For this reason, the test can be made at a high speed. Coupling by the capacitance between the signal lines exists. Therefore, if the signal voltage $v_t$ for the test exerts influences on the signal lines close thereto and the waveform of the output current $i_Y$ is distorted, three rows of signals lines, for example, are used as one set so that two of them are used for the test while one other is kept at a constant potential. This method can stabilize the waveform of each output current $i_Y$.

Figure 23:
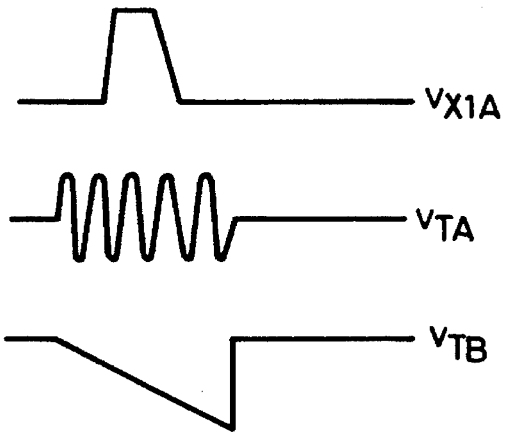

FIG. 21 illustrates the case where the rectangular wave signal is used as the scanning waveform, but the differential waveform of the scanning waveform is superposed due to capacitive coupling between the scanning electrode of the TFT device 201 and the signal electrode, and this component becomes a noise component. To reduce this component, it is possible to use a scanning waveform whose rise and fall are gentle such as represented by a signal $v_{x1A}$ in FIG. 23. Though the signal voltage for the test has a waveform of a ramp function in FIG. 21, the test can, of course, be conducted by use of a waveform of a sine wave such as represented by a signal $v_{TA}$ in FIG. 23 or a waveform a negative ramp function.

In this embodiment, it is also possible to check the breakage of the scanning wirings and signal wirings, the short-circuit of the scanning electrodes and signal electrodes and the position of the breakage by sequentially scanning the scanning voltage $v_{x1}$ in the order of $l_{x1}$, $l_{x2}$, $l_{x3}$, . . . and checking the positions of the output terminals $l_{y1}$, $l_{y2}$, $l_{y3}$, . . . of the output current $i_Y$. In other words, if the breakage occurs between the kth column and k+1th column in the scanning electrodes $l_{xn}$, any of the waveforms shown in FIG. 21 can be observed for the pixels up to the kth column upon the application of the scanning voltage $v_{xn}$, but a waveform on which the differential waveform of the scanning voltage is not superposed is outputted as to the waveforms shown in FIG. 21(*b*) or 21(*c*).

If the breakage occurs between the kth row and the k+1th row in the signal electrode $l_{yn}$, the output current $i_Y$ of the signal electrodes $l_{yn}$ due to the scanning voltage can be observed up to the kth row, but cannot be observed any longer for the signal electrodes after the k+1th row.

On the other hand, if the short-circuit exists between particular scanning electrode and signal electrode, a large current is observed because the scanning voltage is directly impressed on the output terminal $l_y$ when the scanning voltage $v_x$ is applied to the short-circuited scanning line.

As described above, it is possible to check any defect of TFT as the semiconductor switching device in the display portion, the breakage of the wirings and the short-circuit between the wirings.

In the pixel having the construction described above, the capacity 206 is connected between the pixel electrode 204 and the signal electrode 202', but when the display device is operated as a display after the seal of a liquid crystal, a heretofore known driving method can be naturally employed without any modification.

Figure 24:
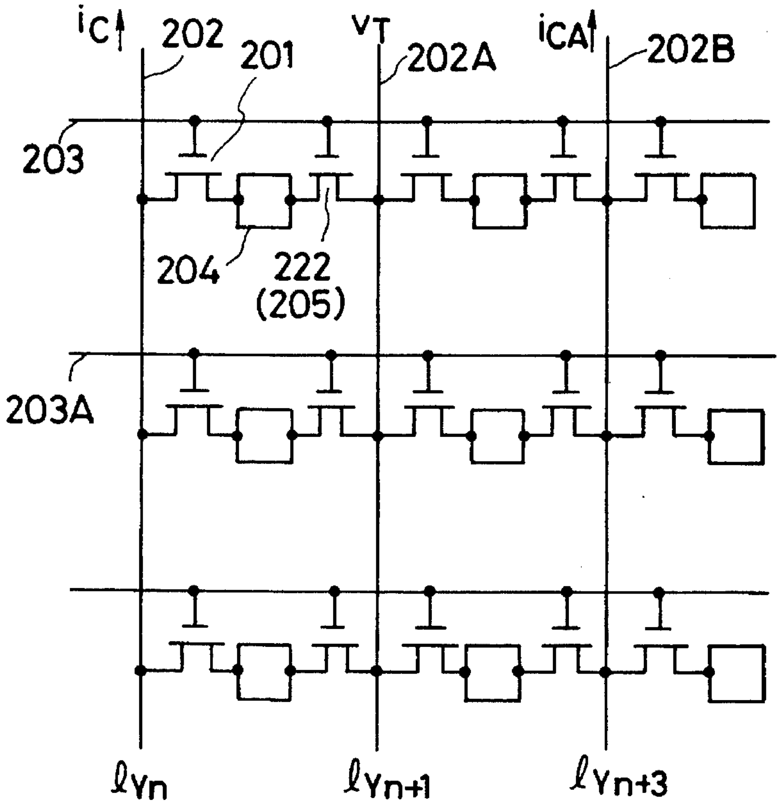

FIG. 24 is a circuit diagram showing still another definite embodiment of the present invention.

FIG. 24 shows an embodiment wherein a TFT device 222 is used in place of the device 205 shown in FIG. 16(*a*). This embodiment can increase the output current $i_Y$ in comparison with the embodiment of FIG. 17 using the capacity $C_t$, and has the advantage that the influence of the capacitance existing inside the TFT device 201 or between the wirings becomes less.

Figure 25:
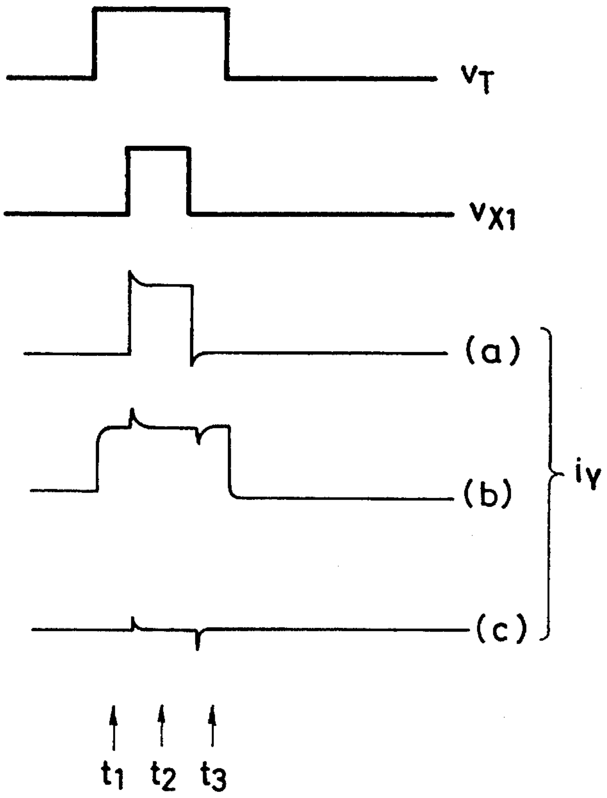

The construction of the testing circuit for checking these embodiments may be one that is shown in FIG. 20, and a voltage having a waveform shown in FIG. 25 may be used as the impressed voltage. However, three signal lines $l_{Yn}$, $l_{Y+1}$, $l_{Y+2}$ are used as one set for the test lest the output voltage $i_C$ interfere with one another. The characteristics of the TFT device 201 are evaluated by detecting the signal currents $i_C$ and $i_{CA}$ from the signal lines $l_{Yn}$ and $l_{Yn+2}$ on both sides of the signal line $l_{Yn+1}$ to which the test voltage $V_T$ is applied. This operation will be described more definitely. If the source to drain path of one of the two TFT devices 201 in one pixel is short-circuited during the normal operation of the TFT devices, a waveform such as shown in FIG. 25(*a*) can be observed. If the source to drain paths of the two TFT devices are short-circuited, a waveform such as shown in FIG. 25(*b*) can be observed. If the source to drain paths of both of the TFT devices are open, a waveform such as shown in FIG. 25(*c*) can be observed. The three kinds of state are judged by comparing the current at each point of time $t_1$, $t_2$, $t_3$ and the defect of the TFT devices in the display portion can thus be checked.

This embodiment can also check the breakage of the scanning electrodes and signal electrodes and the short-circuit between the respective electrodes by checking the scanning voltage and the positions of the output waveforms in the same way as in the afore-mentioned embodiments.

When the construction of the embodiment shown in FIG. 24 is operated after the seal of a display member such as a liquid crystal, the shape of TFT 222 must be designed so that the ratio of the channel width W to the channel length L, that is, W/L, is sufficiently smaller than that of TFT1 in order to first effect the line sequential scanning. This arrangement can apply a sufficient voltage to the signal electrodes $l_{yn}$ and can realize satisfactory display. When the dot sequential scanning is to be made in the construction shown in FIG. 24, the signal voltage applied from the signal electrodes $l_{Yn}$ passes through the TFT device 222 and leaks to the adjacent signal electrodes $l_{Yn+1}$ so that display becomes possible. In any case, this embodiment is effective as a testing method of an active matrix display using the line sequential scanning.

Figure 26:
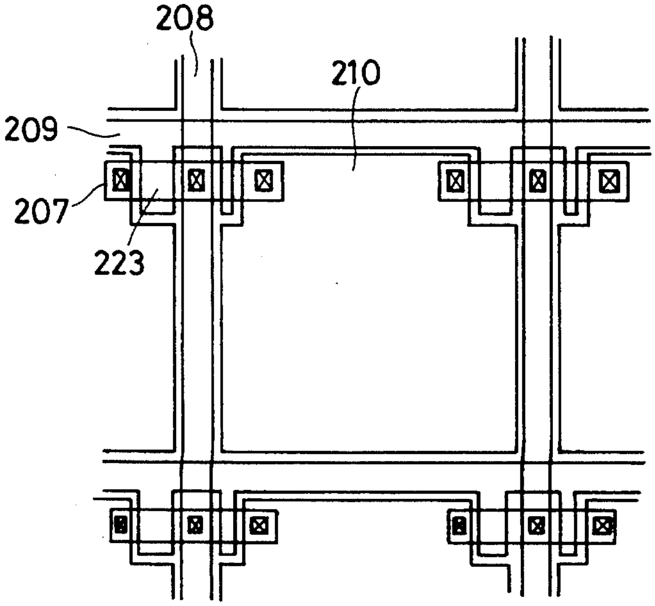

FIG. 26 is a plan view showing a planar structure of the display portion which realizes this embodiment. In FIG. 26, a TFT device 223 corresponding to the TFT device 222 shown in FIG. 24 is formed on the same semiconductor island as a TFT device 201 of an adjacent pixel. According to this construction, a display can be produced without significantly lowering a pixel open ratio.

Figure 27:
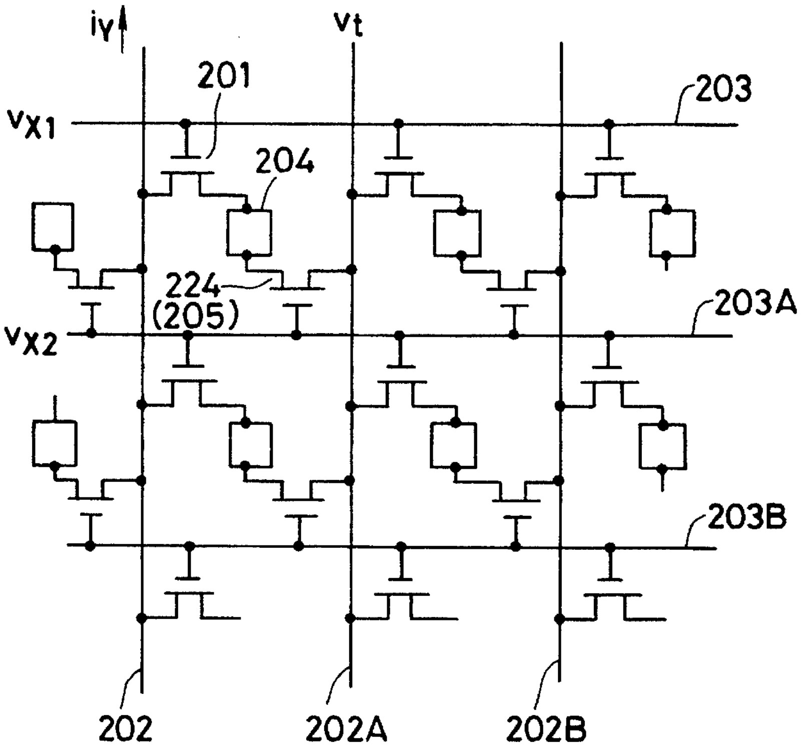

FIG. 27 is a circuit diagram showing still another embodiment of the present invention and illustrates a modified embodiment of the embodiment shown in FIG. 24. Here, a TFT device 224 corresponds to the device 205 shown in FIG. 1(*a*).

The difference of the embodiment shown in FIG. 27 from the embodiment of FIG. 24 lies in that the gate electrode of the TFT device 224 is connected to the scanning electrode 203 of a next stage with the other being kept unchanged.

Figure 28:
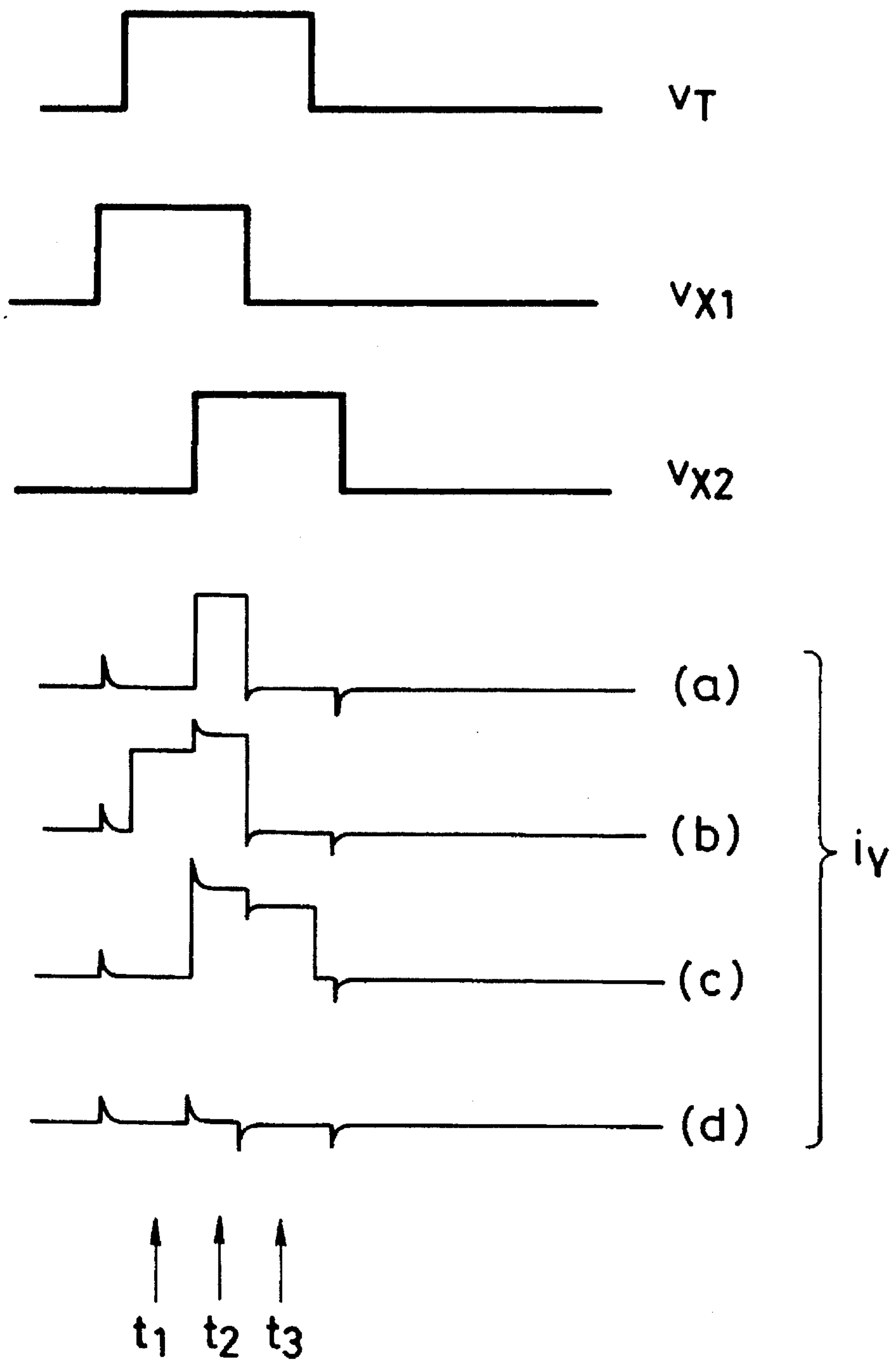

Waveforms such as shown in FIG. 28 may be used in order to check the embodiment described above. The device such as shown in FIG. 20 may be used as the device to be connected to the circuit described above in order to conduct the test. Here, the timings of the application of signals shown in FIG. 28 are different from those shown in FIG. 25. In other words, the scanning voltages $v_{x1}$, $v_{x2}$ to be applied to the scanning electrodes 203 and 203A are deviated from and superposed on the testing signal voltage $V_T$ of a rectangular waveform to be applied to the signal electrode 202A. According to this waveform, the output current $i_Y$ assumes the waveform of FIG. 28(*a*) when both of the two TFTs 201 and 224 of one pixel operate normally, assumes the waveform of FIG. 28(*b*) when the source to drain path of TFT 224 is always short-circuited, assumes the waveform of FIG. 28(*c*) when the source to drain path of TFT 201 is always short-circuited, and further assumes the waveform of FIG. 28(*d*) when the source to drain path of at least one of TFTs 201 and 224 is always kept open.

The current is observed for such waveforms at each time $t_1$, $t_2$, $t_3$ in order to judge the four kinds of states described above. In other words, one more data of defect judgment adds to the embodiment shown in FIG. 25.

This embodiment can also check the breakage of the scanning wirings and signal wirings and the short-circuit between these wirings in the same way as in the embodiments described already.

In this embodiment, when a display is operated after a display member such as a liquid crystal is sealed, both line sequential scanning and dot sequential scanning can be made. If the heretofore known driving method is used, however, the application timing of the signal voltage which determines the display state is delayed one line by one. In other words, in the prior art devices, the scanning voltage is applied to the scanning electrode 203 and applied to the display electrode 204 through TFT 201. In contrast, in accordance with this embodiment, the scanning voltage is applied to the scanning electrode 203A, and the impressed signal voltage is re-written at the scanning timing of the previous one line, thereby determining the voltage of the display electrode. Unlike the embodiment shown in FIG. 25, since TFT 224 plays the role of applying the signal voltage to the pixel electrode 204, and hence TFT 224 must be designed so that its channel width-to-channel length ratio W/L is equal to that of TFT 201.

In this embodiment, the signal voltage can be applied to the pixel electrode 204 even when a defect occurs in either one of TFTs 201 and 224 and the source and drain are always open, or when the breakage occurs in the electrode of either one of the set consisting of the scanning electrode 203 connected to TFT 201 and the signal electrode 202 and the set consisting of the scanning electrode 203A connected to TFT 224 and the signal electrode 202A. In other words, when the embodiment is used as a display, redundancy occurs in the circuit and has a construction effective for the remedy of the defect. When such a defect occurs, a signal voltage which is the same as the signal voltage applied to the adjacent pixel is also applied, but the display picture mostly has an intermediate tone display such as a television picture. Therefore, the embodiment is particularly effective for the picture whose density does not change drastically.

Figure 29:
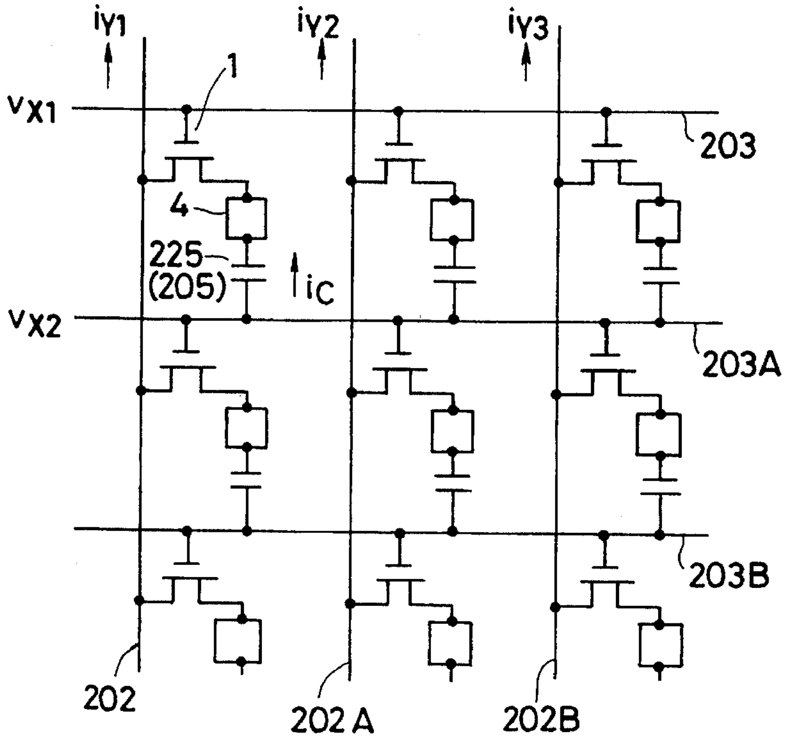
Figure 30:
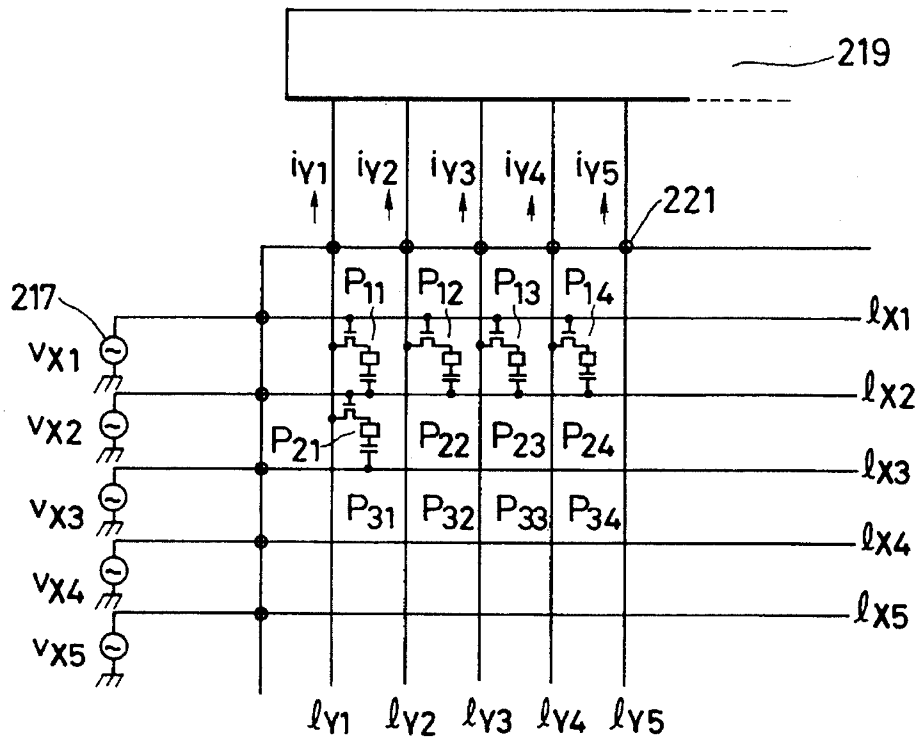
Figure 31:
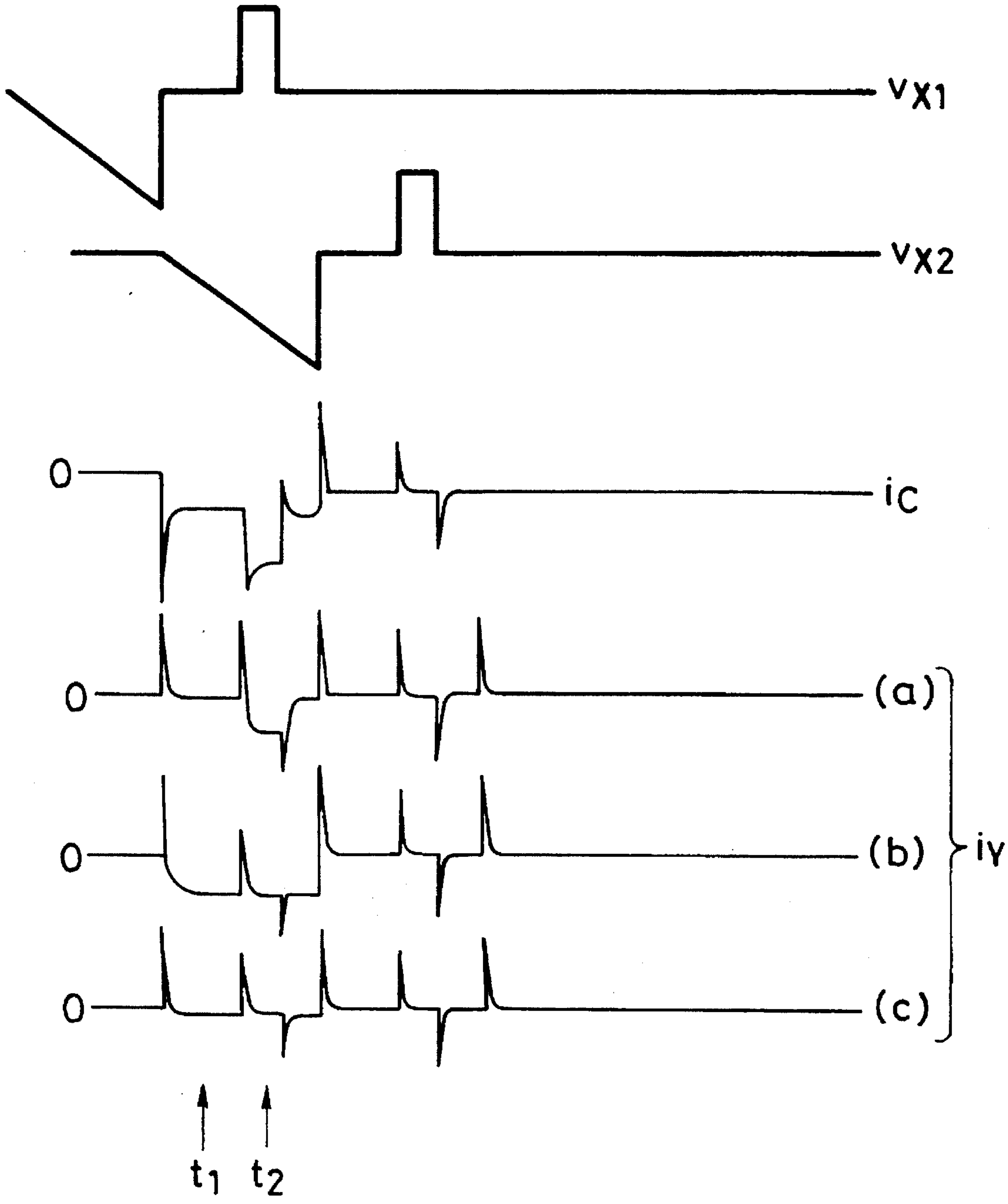

FIG. 29 is a circuit diagram showing the definite circuit construction of the embodiment shown in FIG. 16(*c*). A capacitance 225 corresponds to the device 205 shown in FIG. 16(*c*). When the circuit of this embodiment is tested, a circuit such as shown in FIG. 30 is connected to the display substrate to make the test. The difference of the embodiment shown in FIG. 30 from the embodiment of FIG. 20 lies in that the power source 216 and the switch circuit 218 are omitted. The relation of the waveforms of the scanning voltages $v_{x1}$, $v_{x2}$, $v_{x3}$, . . . and mutual timing in the circuit shown in FIG. 30 are illustrated in FIG. 31. In other words, the scanning voltages $v_{x1}$, $v_{x2}$, $v_{x3}$, . . . have two functions of a ramp function-like testing signal voltage which has by itself a negative gradient and a scanning voltage. Therefore, the switch circuit 218 connected to the electrodes on the signal side in the testing method shown in FIG. 20 is not necessary.

Next, the operation of the embodiment will be described with reference to FIGS. 29 and 31. The scanning voltage $v_{x1}$, $v_{x2}$, $v_{x3}$, . . . are to be applied to the scanning electrodes $l_{x1}$, $l_{x2}$, $l_{x3}$, . . . and have a waveform prepared by superposing the testing signal voltage on the scanning voltage. In other words, in FIG. 31, the ramp function-like voltage having a negative gradient is the testing signal voltage, and the voltage having a rectangular waveform is the scanning voltage. Here, the ramp function-like voltage is set to be a negative value in order to prevent the TFT device from being turned ON by the testing voltage because the TFT device has an n-channel structure. If the TFT device has a p-channel structure, the polarities of the testing voltage and scanning voltage must be inversed, i.e., the ramp function-like testing voltage has a positive value and the scanning voltage, a negative value.

In FIG. 29, the voltage $v_{x1}$ is applied to the scanning electrode 203 and the voltage $v_{x2}$, to the scanning electrode 203A at the timing shown in FIG. 31. At this time, the current $i_C$ flowing through the capacitance 225 is determiend by the rise characteristics of the ramp function voltage and by the capacitance dependent on the circuit ranging from the scanning electrode 203A to the signal electrode 202, at the time of application of the ramp function voltage $v_{x2}$. If the voltage $v_{x1}$ applied to the scanning electrode 203 exceeds the threshold voltage of TFT 201 during this period, the source-drain of TFT 201 is turned ON and is in the short-circuit state. Therefore, the current flowing through the capacitance 225 increases in the negative direction. If the current waveform outputted from the signal electrode 202 is observed, the waveform shown in FIG. 31(*b*) can be seen when the source-drain of TFT 201 operates normally, the waveform shown in FIG. 31(*b*) can be seen when the source-drain of TFT 201 is always short-circuited, and the waveform shown in FIG. 31(*c*) can be seen when the source-drain is always open. In this case, if the current values are measured at the time $t_1$ and $t_2$, the device characteristics of TFT can be tested. In this embodiment, it is possible to check the position of a defective TFT, the breakage and short-circuit of the wirings and the positions of such problems by evaluating the terminal positions of the scanning voltage and the output current in the same way as the method described already.

Figure 32:
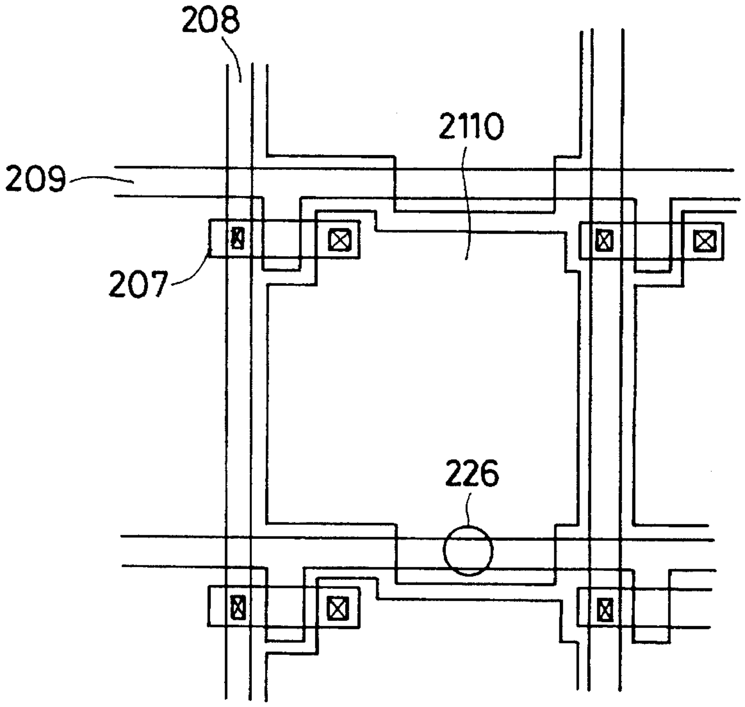

FIG. 32 is a plan view showing the planar structure of the display portion so as to realize the embodiment shown in FIG. 29. A capacitance portion 226 is formed between the pixel electrode 210 consisting of a transparent electrode and the scanning electrode 209. In this manner, the structure of this embodiment can form the capacitance without adding any new process in particular.

When the construction of this embodiment is used as a display after a display member such as a liquid crystal is sealed, the heretofore known driving methods such as the line sequential scanning method, the dot sequential scanning method, and the like, can naturally be used without changing them at all.

In accordance with the embodiments described above, it is possible to measure the existence of any defect inside the display portion by use of conventional scanning and signal wirings and by disposing the devices for checking the defects of the TFT devices and wirings in the display pixel of the active matrix display, but without requiring new wirings for the inspection. Therefore, the method of checking the devices can be simplified and the inspection speed can be improved. In addition, since the test can be made under the state of the substrate before a display member such as a liquid crystal is sealed or laminated, a display which has defects is not subjected to the liquid crystal sealing process, and hence the production process can be simplified.

Since the embodiments use the pulse voltage for the test and the multi-channel current detection circuit is used in order to detect the output, the measurement time for one substrate can be reduced drastically. Moreover, the display portion does not undergo degradation because contact by a probe or inspection by an electron beam or light is not made to the display portion.

The present invention can test the function of a semiconductor switching device in which one of the main terminals is open.

In accordance with the present invention, the devices for checking the defects of semiconductor switching devices and wirings are disposed in the display pixels of the matrix display. Therefore, there is no need to dispose new wirings, and the test of the devices can be made easily and quickly. Furthermore, since the test can be made before the display member is sealed, the production process can be simplified.

What is claimed is:

1. In an apparatus including:

a plurality of first signal lines;

a plurality of second signal lines crossing said first signal lines; and a plurality of semiconductor devices, each disposed at each intersection point of one of the plurality of said first signal lines and one of the plurality of said second signal lines, and each semiconductor device having a control terminal connected to a corresponding one of the plurality of said first signal lines to which the semiconductor device is connected, a first main terminal connected to a corresponding one of the plurality of said second signal lines to which the semiconductor device is connected, and a second main terminal which is electrically isolated from the outside by a dielectric material; a testing method for each of the semiconductor devices comprising the steps of:

(a) applying a voltage which changes with time to said second main terminal through the dielectric material;

(b) applying a control signal which controls conduction and non-conduction of said semiconductor device to said control terminal; and (c) detecting a displacement current flowing through at least one of said two main terminals and said control terminal.

2. A testing method of a semiconductor device according to claim 1 wherein an electrode of a transparent conductive film is disposed on the first main terminals of said semiconductor devices.

3. A testing method of a semiconductor device according to claim 2 wherein said electrode of the transparent conductive film is a pixel electrode.

4. A testing method of a semiconductor device according to claim 1 wherein said dielectric is an insulator.

5. A testing method of a semiconductor device according to claim 4 wherein said insulator covers a transparent conductive film disposed on the first main terminals of said semiconductor devices.

6. A testing method of semiconductor device according to claim 1 wherein said voltage which changes with time is a voltage whose dv/dt is substantially constant.

7. A testing method of a semiconductor device according to claim 1 wherein a control signal which controls said conduction and non-conduction is applied before the start of the change of said voltage which changes with time.

8. A testing method of a semiconductor device according to claim 1 wherein said dielectric is a shading film of said semiconductor device.

9. A method according to claim 1, wherein the voltage which changes with time is a ramp voltage.

10. A method according to claim 1, wherein the voltage which changes with time is a sine wave voltage.

11. A method for testing whether or not a semiconductor device has an on-off function, wherein said semiconductor has two main terminals and a control terminal, and wherein one of said two main terminals is isolated electrically by a dielectric material from the outside, said method comprising the steps of:

(a) applying a voltage which changes with time to said one of two main terminals through the dielectric material;

(b) applying a control signal which controls conduction and non-conduction of said semiconductor device to said control terminal; and (c) detecting a displacement current flowing through at least one of said two main terminals and said control terminal.

12. A testing method of a semiconductor device according to claim 11 wherein an electrode comprised of a transparent conductive film is disposed on the other of said main terminals of said semiconductor device which is not isolated electrically from the outside.

13. A testing method of a semiconductor device according to claim 12 wherein said electrode of the transparent conductive film is a pixel electrode.

14. A testing method of a semiconductor device according to claim 11 wherein said dielectric is an insulator.

15. A testing method of a semiconductor device according to claim 14 wherein said insulator covers a transparent conductive film disposed on the other of said main terminals of said semiconductor device.

16. A testing method of a semiconductor device according to claim 11 wherein said voltage which changes with time is a voltage whose dv/dt is substantially constant.

17. A testing method of a semiconductor device according to claim 11 wherein a control signal which controls said conduction and non-conduction is applied before the start of the change of said voltage which changes with time.

18. A testing method of a semiconductor device according to claim 11 wherein said dielectric is a shading film of said semiconductor device.

19. A method according to claim 11, wherein the voltage which changes with time is a ramp voltage.

20. A method according to claim 11, wherein the voltage which changes with time is a sine wave voltage.

* * * * *